US010510822B2

(12) United States Patent
Kim et al.

(10) Patent No.: US 10,510,822 B2
(45) Date of Patent: Dec. 17, 2019

(54) DISPLAY DEVICE

(71) Applicant: Samsung Display Co., Ltd., Yongin-si, Gyeonggi-do (KR)

(72) Inventors: Yang Wan Kim, Yongin-si (KR); Ji Hyun Ka, Yongin-si (KR); Tae Hoon Kwon, Yongin-si (KR); Byung Sun Kim, Yongin-si (KR); Hyung Jun Park, Yongin-si (KR); Su Jin Lee, Yongin-si (KR); Jae Yong Lee, Yongin-si (KR); Jin Tae Jeong, Yongin-si (KR); Seung Ji Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 15/976,680

(22) Filed: May 10, 2018

(65) Prior Publication Data

US 2018/0331171 A1 Nov. 15, 2018

(30) Foreign Application Priority Data

May 11, 2017 (KR) ......................... 10-2017-0058897

(51) Int. Cl.
*H01L 29/08* (2006.01)
*H01L 27/32* (2006.01)
(Continued)

(52) U.S. Cl.
CPC ....... *H01L 27/3276* (2013.01); *G09G 3/3233* (2013.01); *H01L 27/3223* (2013.01);
(Continued)

(58) Field of Classification Search
CPC ............ H01L 27/3223; H01L 27/3265; H01L 27/3272; H01L 27/3276; H01L 51/5218;
(Continued)

(56) References Cited

U.S. PATENT DOCUMENTS

2008/0084365 A1 4/2008 Takahara et al.
2009/0102824 A1 4/2009 Tanaka et al.
(Continued)

FOREIGN PATENT DOCUMENTS

EP 2085952 A1 8/2009
KR 10-1372014 B1 3/2014

OTHER PUBLICATIONS

EPO Extended Search Report dated Sep. 20, 2018, for corresponding European Patent Application No. 18171952.7 (9 pages).

*Primary Examiner* — Brook Kebede
(74) *Attorney, Agent, or Firm* — Lewis Roca Rothgerber Christie LLP

(57) ABSTRACT

A display device includes a substrate having a display area and a non-display area, a plurality of pixels in the display area, scan lines for supplying a scan signal to the pixels, the scan lines extending in a first direction, data lines for supplying a data signal to the pixels, the data lines extending in a second direction crossing the first direction, and a first dummy part in the non-display area, adjacent to an outermost pixel, connected to an outermost data line of the display area, forming a parasitic capacitor with the outermost pixel, and including a first dummy data line and a first dummy power pattern extending in parallel to the data lines.

41 Claims, 19 Drawing Sheets

(51) Int. Cl.
*G09G 3/3233* (2016.01)
*H01L 51/52* (2006.01)
(52) U.S. Cl.
CPC ...... *H01L 27/3265* (2013.01); *H01L 27/3272* (2013.01); *H01L 51/5218* (2013.01); *H01L 51/5234* (2013.01); *H01L 51/5237* (2013.01); *H01L 27/3258* (2013.01); *H01L 2251/5323* (2013.01)
(58) Field of Classification Search
CPC ............ H01L 51/5234; H01L 51/5237; G09G 3/3225; G09G 3/3233
USPC .................................. 257/40; 345/103, 205
See application file for complete search history.

(56) References Cited

U.S. PATENT DOCUMENTS

| | | | |
|---|---|---|---|
| 2015/0325593 A1 | 11/2015 | Shih et al. | |
| 2016/0189644 A1* | 6/2016 | So ........................ | G09G 3/3233 345/205 |
| 2016/0321992 A1* | 11/2016 | Kim ..................... | G09G 3/3225 |
| 2017/0062544 A1 | 3/2017 | Kang | |
| 2017/0309651 A1* | 10/2017 | Kim .................... | H01L 27/1225 |

* cited by examiner

DISPLAY DEVICE

CROSS-REFERENCE TO RELATED APPLICATION

This application claims priority to, and the benefit of, Korean Patent Application No. 10-2017-0058897, filed on May 11, 2017, in the Korean Intellectual Property Office, the entire disclosure of which is incorporated by reference herein.

BACKGROUND

1. Field

An aspect of the present disclosure relates to a display device.

2. Description of the Related Art

Among display devices, an organic light emitting display device includes two electrodes and an organic emitting layer located between the two electrodes. In the organic light emitting display device, electrons injected from one electrode and holes injected from the other electrode are combined in the organic emitting layer so as to form excitons, and the excitons emit light through energy emission.

SUMMARY

Embodiments provide a display device having improved display quality.

According to an aspect of the present disclosure, there is provided a display device including a substrate having a display area and a non-display area, a plurality of pixels in the display area, scan lines for supplying a scan signal to the pixels, the scan lines extending in a first direction, data lines for supplying a data signal to the pixels, the data lines extending in a second direction crossing the first direction, and a first dummy part in the non-display area, adjacent to an outermost pixel, connected to an outermost data line of the display area, forming a parasitic capacitor with the outermost pixel, and including a first dummy data line and a first dummy power pattern extending in parallel to the data lines.

Each of the pixels may include a transistor, and an organic light emitting device connected to the transistor, the transistor including an active pattern on the substrate, source and drain electrodes each connected to the active pattern, a gate electrode overlapping with the active pattern with a gate insulating layer interposed therebetween, and an interlayer insulating layer covering the gate electrode, and including a first interlayer insulating layer, a second interlayer insulating layer, and a third interlayer insulating layer, which are sequentially stacked.

The display device may further include a power line for supplying a power source to the pixels, and including a first power supply line on the second interlayer insulating layer and parallel to the data lines, and a second power supply line on the third interlayer insulating layer, and including first lines parallel to the data lines, and second lines connecting adjacent ones of the first lines to each other.

The data lines may be on the second interlayer insulating layer.

The scan lines may be on the gate insulating layer.

The first dummy power pattern may include a dummy first power line on the second interlayer insulating layer, and parallel to the first power supply line, and a dummy second power line on the third interlayer insulating layer, parallel to the first lines of the second power supply line, and electrically connected to the dummy first power line.

The dummy second power line may be connected to the second lines of the second power supply line.

Each of the pixels may further include a compensation transistor connected to the gate electrode of the transistor, and configured to be turned on when a scan signal is supplied to a corresponding one of the scan lines to cause the transistor to be diode-connected.

Each of the pixels may further include a shielding pattern on the first interlayer insulating layer, and covering at least a portion of the compensation transistor.

The shielding pattern of one of the pixels may be connected to a first power supply line of an adjacent pixel in a direction toward the outermost pixel.

Each of the pixels may further include a storage capacitor including a lower electrode on the gate insulating layer, and an upper electrode on the first interlayer insulating layer.

The first dummy part may further include a dummy semiconductor pattern on the same layer as the active pattern, and extending parallel to the first dummy data line, and a first dummy shielding pattern on the first interlayer insulating layer, connected to the dummy first power line, and covering at least a portion of the compensation transistor of the outermost pixel.

The display area may include a first display area in which lengths of the scan lines are the same, and a second display area at at least one side of the first display area, and in which lengths of respective ones of the scan lines decrease as the scan lines become more distant from the first display area.

The first dummy part may be in the non-display area corresponding to the first display area.

The display device may further include a second dummy part in the non-display area adjacent to an outermost pixel of the second display area, and forming a parasitic capacitor with the outermost pixel of the second display area.

The second dummy part may include a second dummy data line and a second dummy power pattern, which extend in parallel to the data lines.

The second dummy data line and the second dummy power pattern may have a shape extending from a data line and a first power line, which are connected to a pixel connected to one of the scan lines that is more adjacent to the first display area than another of the scan lines that is connected to the outermost pixel.

The second dummy part may further include a second dummy shielding pattern on the first interlayer insulating layer, and connected to the second dummy power pattern.

The second dummy shielding pattern may cover the compensation transistor of the outermost pixel of the second display area.

A width of the second dummy part in the first direction may be less than that of each pixel.

A width of the first dummy part in the first direction may be less than that of each pixel.

According to an aspect of the present disclosure, there is provided a display device including a substrate including a display area and a non-display area, a plurality of pixels in the display area and each including an organic light emitting device, a driving transistor connected to the organic light emitting device, and a compensation transistor for compensating for a threshold voltage of the driving transistor, scan lines for supplying a scan signal to the pixels, and extending in a first direction, data lines for supplying a data signal to the pixels, and extending in a second direction crossing the first direction at a respective side of the pixels, and a first dummy part at another side of an outermost pixel opposite a respective one of the data lines, connected to an outermost data line of the display area, forming a parasitic capacitor with the outermost pixel, including a first dummy data line and a first dummy power pattern, which extend in parallel to the data lines, and forming a parasitic capacitor with the driving transistor and the compensation transistor.

The first dummy part and the compensation transistor of the outermost pixel may be adjacent to each other.

A distance between the first dummy part and the compensation transistor of the outermost pixel may be less than that between the compensation transistor of the outermost pixel and the outermost data line.

The compensation transistor may be connected to a gate electrode of the driving transistor, and is turned on when a scan signal is supplied to cause the driving transistor to be diode-connected.

The driving transistor may include an active pattern on the substrate, source and drain electrodes each connected to the active pattern, a gate electrode overlapping with the active pattern with a gate insulating layer interposed therebetween, and an interlayer insulating layer covering the gate electrode, and including a first interlayer insulating layer, a second interlayer insulating layer, and a third interlayer insulating layer, which are sequentially stacked.

The display device may further include a power line for supplying a power source to the pixels, and including a first power supply line on the second interlayer insulating layer, and parallel to the data lines, and a second power supply line on the third interlayer insulating layer, and including first lines parallel to the data lines, and second lines connecting adjacent ones of the first lines to each other.

The first dummy power pattern may include a dummy first power line on the second interlayer insulating layer, and parallel to the first power supply line, and a dummy second power line on the third interlayer insulating layer, parallel to the first lines, and electrically connected to the dummy first power line.

The dummy second power line may be connected to the second lines.

Each of the pixels may further include a shielding pattern on the first interlayer insulating layer, and covering at least a portion of the compensation transistor.

The shielding pattern of one of the pixels may be connected to the first power supply line of an adjacent pixel in a direction toward the outermost pixel.

The first dummy part may further include a dummy semiconductor pattern on the same layer as the active pattern, and extending in a direction parallel to the first dummy data line, and a first dummy shielding pattern on the first interlayer insulating layer, connected to the dummy first power line, and covering at least a portion of the compensation transistor of the outermost pixel.

The display area may include a first display area in which lengths of the scan lines are the same, and a second display area at at least one side of the first display area, in which lengths of respective ones of the scan lines decrease as the scan lines become more distant from the first display area.

The first dummy part may be in the non-display area corresponding to the first display area.

The display device may further include a second dummy part in the non-display area, adjacent to an outermost pixel of the second display area, forming a parasitic capacitor with the outermost pixel of the second display area, and including a second dummy data line and a second dummy power pattern, which extend in parallel to the data lines.

The second dummy data line and the second dummy power pattern may have a shape extending from a data line and a first power line, which are connected to a pixel connected to one of the scan lines that is more adjacent to the first display area than another of the scan lines that is connected to the outermost pixel.

The second dummy part may further include a second dummy shielding pattern on the first interlayer insulating layer, and connected to the second dummy power pattern.

The second dummy shielding pattern may cover the compensation transistor of the outermost pixel of the second display area.

A width of the second dummy part in the first direction may be less than that of each pixel.

A distance between the second dummy part and the compensation transistor of the outermost pixel of the second display area may be less than that between the compensation transistor of the outermost pixel and the outermost data line.

A width of the first dummy part in the first direction may be less than that of each pixel.

DETAILED DESCRIPTION

Figure 1:
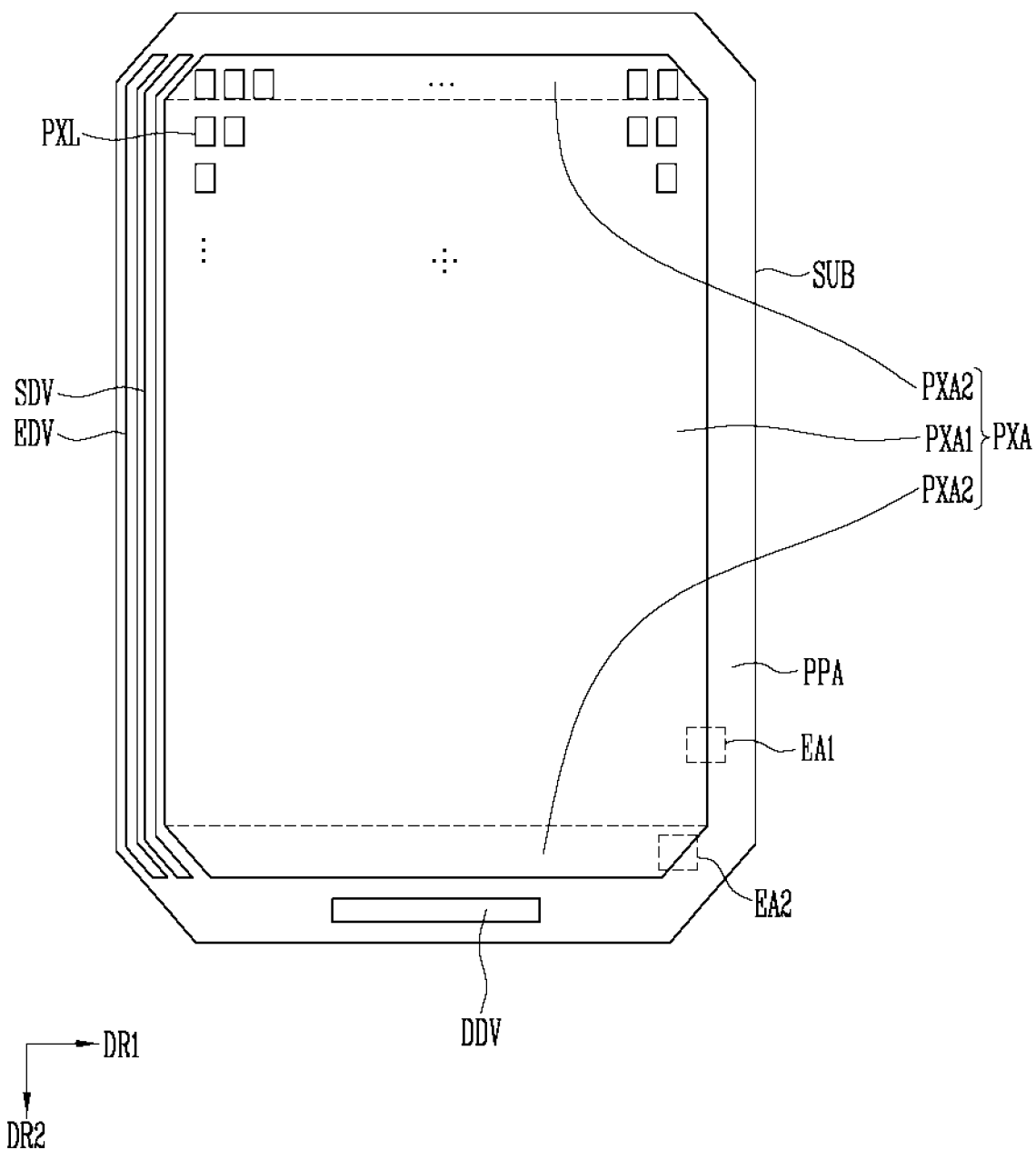
FIG. 1 is a plan view illustrating a display device according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to an embodiment of the present disclosure.

Referring to FIG. 1, the display device according to the present disclosure may include a substrate SUB, pixels PXL provided on the substrate SUB, a driving unit that is provided on the substrate SUB and drives the pixels PXL, and a line unit that allows the pixels PXL and the driving unit to be connected to each other therethrough.

The substrate SUB may have various shapes. For example, the substrate SUB may have a closed polygonal shape including linear sides. The substrate SUB may also have a shape such as a circle or ellipse including curved sides. The substrate SUB may also have a shape such as a semicircle or semi-ellipse including both linear and curved sides. In an embodiment of the present disclosure, when the substrate SUB has linear sides, at least some corners of each of the shapes may be formed in a curve. For example, when the substrate SUB has a rectangular shape, a portion at which adjacent linear sides meet each other may be replaced with a curve (e.g., a curve having a predetermined curvature). That is, a vertex portion of the rectangular shape may be formed with a curved side having both adjacent ends respectively connected to two adjacent linear sides (e.g., the curved side may have a predetermined curvature). The curvature may be differently set depending on positions. For example, the curvature may be changed depending on a position at which the curve is started, a length of the curve, etc.

When the substrate SUB includes a plurality of areas, each area may also be provided in various shapes, such as a closed polygon including linear sides, a circle and an ellipse, including curved sides, and a semicircle and a semi-ellipse, including linear and curved sides.

The substrate SUB may include a display area PXA and a non-display area PPA.

The display area PXA is an area in which the pixels PXL that display an image are provided. Embodiments of the pixel PXL will be described later. The display area PXA may have various shapes. For example, the display area PXA may have a shape corresponding to the substrate SUB.

For example, the display area PXA may have a closed polygonal shape including linear sides. The display area PXA may also have a shape such as a circle or ellipse including curved sides. The display area PXA may also have a shape such as a semicircle or semi-ellipse including linear and curved sides. In an embodiment of the present disclosure, when the display area PXA has linear sides, at least some of corners of each of the shapes may be formed in a curve. For example, when the display area PXA has a rectangular shape, a portion at which adjacent linear sides meet each other may be replaced with a curve (e.g., a curve having a predetermined curvature). That is, a vertex portion of the rectangular shape may be formed with a curved side having both adjacent ends respectively connected to two adjacent linear sides. The curvature may be differently set depending on positions. For example, the curvature may be changed depending on a position at which the curve is started, a length of the curve, etc.

In an embodiment of the present disclosure, the display area PXA may include a first display area PXA1 and two second display areas PXA2. Each of the second display areas PXA2 may have a shape in which the width of the second display area PXA2 becomes narrower as the second display area PXA2 becomes more distant from the first display area PXA1 (e.g., becomes narrower in a direction away from the first display area PXA1). For example, each of the second display areas PXA2 may have a trapezoidal shape in which the width of the second display area PXA2 becomes narrower as the second display area PXA2 becomes more distant from the first display area PXA1.

The non-display area PPA is an area in which no image is displayed, as the non-display area PPA may be an area in which the pixels PXL are not provided. The driving unit may drive the pixels PXL, and lines of the line unit allow the pixels PXL and the driving unit to be connected to each other therethrough. The non-display area PPA corresponds to a bezel in a final display device, and the width of the bezel may be determined according to the width of the non-display area PPA.

The non-display area PPA may be provided at at least one side of the display area PXA. In an embodiment of the present disclosure, the non-display area PPA may surround the circumference of the display area PXA. In an embodiment of the present disclosure, the non-display area PPA may include a lateral part extending in the width direction thereof, and a longitudinal part extending the length direction thereof. The longitudinal part of the non-display area PPA may be provided as a pair of parts that are spaced apart from each other along the width direction of the display area PXA.

The pixels PXL may be provided in the display area PXA on the substrate SUB. Each of the pixels PXL is a minimum unit for displaying an image, and may be provided in plural. Each of the pixels PXL may include a light emitting device that emits white light and/or colored light. Each pixel PXL may emit light of any one color among red, green, and blue, but the present disclosure is not limited thereto. For example, the pixel PXL may also emit light of any one color among cyan, magenta, yellow, and white.

The pixels PXL may be arranged in a matrix form along a plurality of rows extending in a first direction DR1, and a plurality of columns extending in a second direction DR2. In an embodiment of the present disclosure, the arrangement of the pixels PXL is not particularly limited, and the pixels PXL may be arranged in various forms. For example, some of the pixels PXL may be arranged such that the first direction DR1 becomes the row direction, but others of the pixels PXL may be arranged such that the row direction becomes a direction different from the first direction DR1 (e.g., becomes a direction oblique to the first direction DR1).

Each of the pixels PXL may include, as a display element, an organic light emitting device including an organic emitting layer, but the present disclosure is not limited thereto. For example, each of the pixels PXL may include various types of display elements, such as a liquid crystal element, an electrophoretic element, and an electrowetting element.

The driving unit provides signals to each pixel PXL through the lines, and accordingly controls driving of the pixels PXL. In FIG. 1, the line unit is omitted for convenience of description, but will be described later.

The driving unit may include a scan driver SDV that provides a scan signal to the pixels PXL through scan lines, an emission driver EDV that provides an emission control signal to the pixels PXL through emission control lines, a data driver DDV that provides a data signal to the pixels PXL through data lines, and a timing controller. The timing controller may control the scan driver SDV, the emission driver EDV, and the data driver DDV.

The scan driver SDV may be provided at the longitudinal part of the non-display area PPA. The longitudinal part of the non-display area PPA is provided as a pair of parts that are spaced apart from each other along the width direction of the display area PXA, and therefore, the scan driver SDV may be provided at at least one of the longitudinal parts of the non-display area PPA. The scan driver SDV may extend along the length direction of the non-display area PPA.

In an embodiment of the present disclosure, the scan driver SDV may be directly mounted on the substrate SUB. When the scan driver SDV is directly mounted on the substrate SUB, the scan driver SDV may be formed together with the pixels PXL in a process of forming the pixels PXL, but the present disclosure is not limited thereto. For example, the scan driver SDV may be formed on a separate chip to be provided in a chip-on-glass manner on the substrate SUB. Also, the scan driver SDV may be formed on a separated chip and then mounted on a printed circuit board, and may then be connected to the substrate SUB through a connection member such as a flexible printed circuit board.

Similar to the scan driver SDV, the emission driver EDV may be provided at the longitudinal part of the non-display area PPA. The emission driver EDV may be provided at at least one of the pair of longitudinal parts of the non-display area PPA. The emission driver EDV may extend along the length direction of the non-display area PPA.

In an embodiment of the present disclosure, the emission driver EDV may be directly mounted on the substrate SUB. When the emission driver EDV is directly mounted on the substrate SUB, the emission driver EDV may be formed together with the pixels PXL in a process of forming the pixels PXL, but the present disclosure is not limited thereto. For example, the emission driver EDV may be formed on a separate chip to be provided in a chip-on-glass manner on the substrate SUB. Also, the emission driver EDV may be formed on a separated chip, and may then be mounted on a printed circuit board, and may be connected to the substrate SUB through a connection member such as a flexible printed circuit board.

In an embodiment of the present disclosure, a case where the scan driver SDV and the emission driver EDV are adjacent to each other and are formed at only one of any side between the pair of longitudinal parts of the non-display area PPA is illustrated as an example. However, the present disclosure is not limited thereto, and the arrangement of the scan driver SDV and the emission driver EDV may be changed in various manners. For example, the scan driver SDV may be provided at one of the longitudinal parts of the non-display area PPA, and the emission driver EDV may be provided at the other of the longitudinal parts of the non-display area PPA. Alternatively, the scan driver SDV (e.g., different parts thereof) may be provided at both of the longitudinal parts of the non-display area PPA, and the emission driver EDV may be provided at only one of the longitudinal parts of the non-display area PPA.

The data driver DDV may be located in the non-display area PPA. For example, the data driver DDV may be located at the lateral part of the non-display area PPA. The data driver DDV may extend along the width direction of the non-display area PPA.

In an embodiment of the present disclosure, the positions of the scan driver SDV, the emission driver EDV, and/or the data driver DDV may be changed, if suitable.

The timing controller may be connected in various manners to the scan driver SDV, the emission driver EDV, and the data driver DDV through the lines. The position at which the timing controller is located is not particularly limited. For example, the timing controller may be mounted on a printed circuit board, to be connected to the scan driver SDV, the emission driver EDV, and the data driver DDV through a flexible printed circuit board. The printed circuit board may be located at various positions, such as at a side of the substrate SUB, or at a back surface of the substrate SUB.

Figure 2:
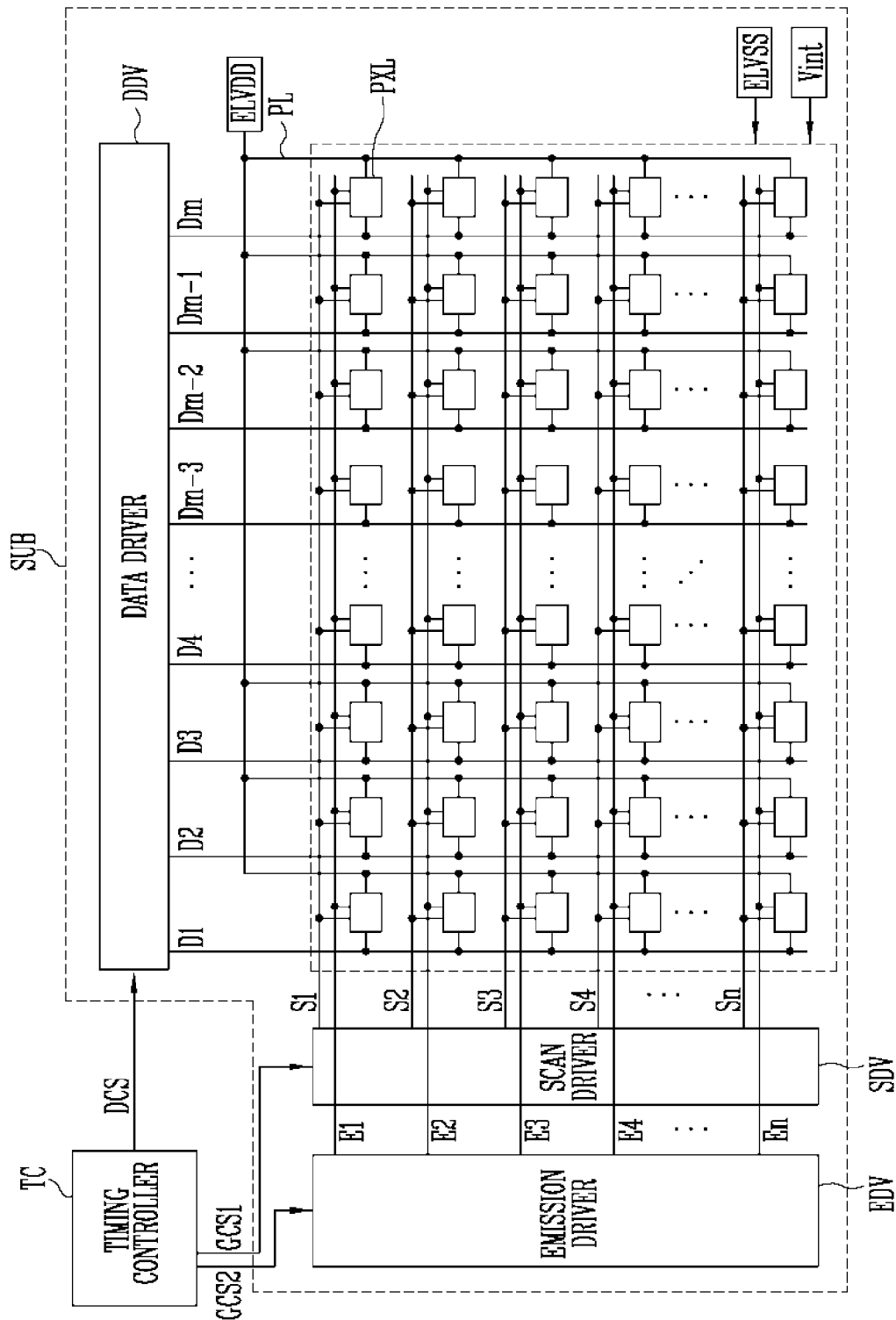
FIG. 2 is a block diagram illustrating an embodiment of pixels and a driving unit according to an embodiment of the present disclosure.

FIG. 2 is a block diagram illustrating an embodiment of the pixels and the driving unit according to the present embodiment.

Referring to FIG. 2, the display device according to the present embodiment may include pixels PXL, a driving unit, and a line unit.

The pixels PXL may include a plurality of pixels. The driving unit may include a scan driver SDV, an emission driver EDV, a data driver DDV, and a timing controller TC. In FIG. 2, positions of the scan driver SDV, the emission driver EDV, the data driver DDV, and the timing controller TC are set for convenience of description, but the present disclosure is not limited thereto. When an actual display device is implemented, the scan driver SDV, the emission driver EDV, the data driver DDV, and the timing controller TC may be located at positions different from those shown in FIG. 2 in the display device.

The line unit provides signals from the driving unit to each pixel PXL, and may include scan lines S1 to Sn, data lines D1 to Dm, emission control lines E1 to En, a power line PL, and a first initialization power line Vint. The scan lines may include a plurality of scan lines S1 to Sn, and the emission control lines may include a plurality of emission control lines E1 to En. The data lines may include a plurality of data lines D1 to Dm. The data lines D1 to Dm and the power line PL may be connected to the pixels PXL.

The pixels PXL may be arranged in the display area PXA shown in FIG. 1. The pixels PXL may be connected to respective ones of the scan lines S1 to Sn, the emission control lines E1 to En, and the data lines D1 to Dm, and may be connected to the power line PL. The pixels PXL may be supplied with a data signal from the data lines D1 to Dm when a scan signal is supplied from the scan lines S1 to Sn.

In addition, the pixels PXL may be supplied with a first power source ELVDD, a second power source ELVSS, and an initialization power source Vint, which may be externally supplied. Here, the first power source ELVDD may be applied through the power line PL.

Each of the pixels PXL may at least include a driving transistor and an organic light emitting diode. The driving transistor may control the amount of current flowing from the first power source ELVDD to the second power source ELVSS via the organic light emitting diode, corresponding to a data signal. Here, before the data signal is supplied, a gate electrode of the driving transistor may be initialized by the voltage of the initialization power source Vint. To this end, the initialization power source Vint may be set to a voltage that is lower than the data signal.

The scan driver SDV may supply the scan signal to the scan lines S1 to Sn in response to a first gate control signal GCS1 from the timing controller TC. For example, the scan driver SDV may sequentially supply the scan signal to the scan lines S1 to Sn. If the scan signal is sequentially supplied to the scan lines S1 to Sn, the pixels PXL may be sequentially selected in units of horizontal lines.

The emission driver EDV may supply the emission control signal to the emission control lines E1 to En in response to a second gate control signal GCS2 from the timing controller TC. For example, the emission driver EDV may sequentially supply the emission control signal to the emission control lines E1 to En.

Here, the emission control signal may be set to have a width that is wider than that of the scan signal. For example, the emission control signal supplied to an ith (i is a natural number) emission control line Ei may be supplied to overlap with, for at least a partial period, both the scan signal supplied to an (i−1)th first scan line Si−1 and the scan signal supplied to an ith scan line Si.

Additionally, the emission control signal may be set to a gate-off voltage (e.g., a high voltage) such that corresponding transistors included in the pixels PXL can be turned off, and the scan signal may be set to a gate-on voltage (e.g., a low voltage) such that corresponding transistors included in the pixels PXL can be turned on.

The data driver DDV may supply the data signal to the data lines D1 to Dm in response to a data control signal DCS. The data signal supplied to the data lines D1 to Dm may be supplied to pixels PXL selected by the scan signal.

The timing controller TC may respectively supply, to the scan driver SDV and the emission driver EDV, the gate control signals GCS1 and GCS2 generated based on externally supplied timing signals. Also, the timing controller TC may supply the data control signal DCS to the data driver DDV.

A start pulse and clock signals may be included in each of the gate control signals GCS1 and GCS2. The start pulse may control a timing of a first scan signal or a first emission control signal. The clock signals may be used to shift the start pulse.

A source start pulse and clock signals may be included in the data control signal DCS. The source start pulse may control a sampling start time of data (e.g., a data sampling start time). The color signals may be used to control a sampling operation of the data.

Figure 3:
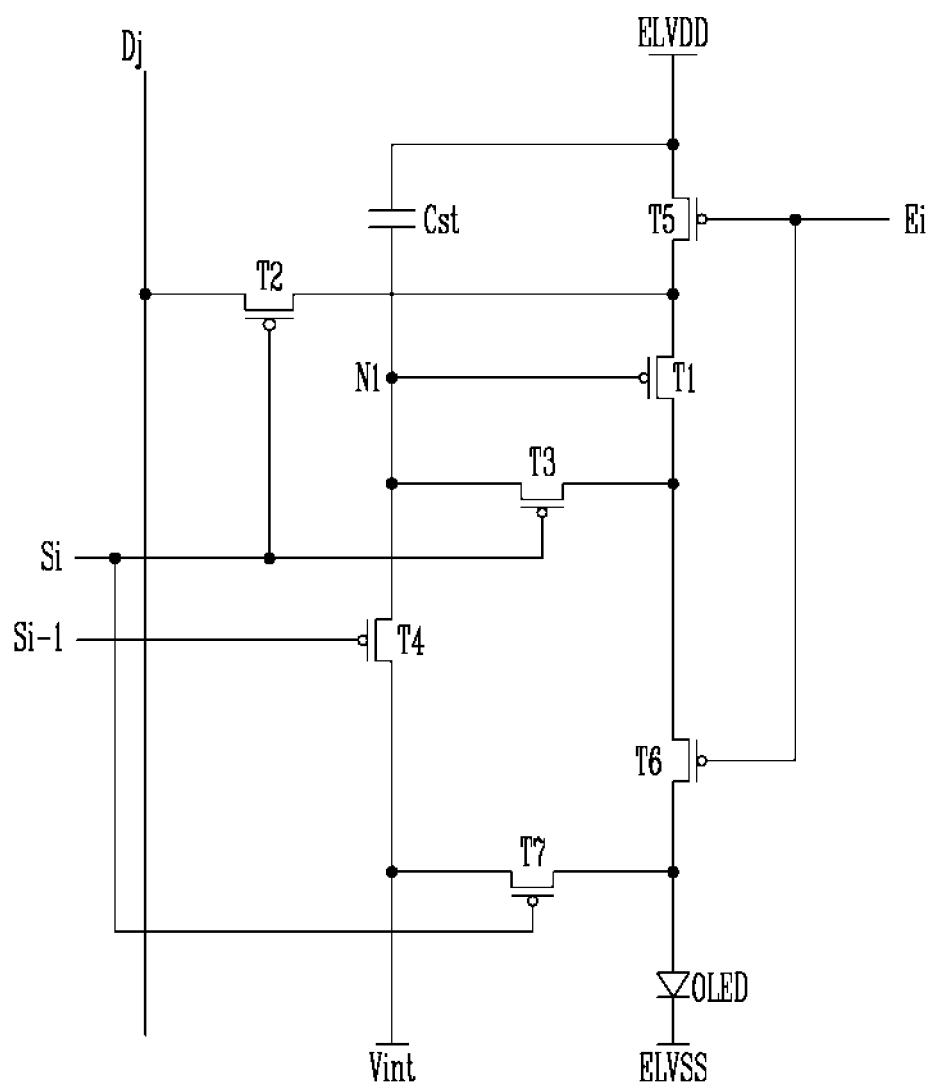
FIG. 3 is an equivalent circuit diagram illustrating an embodiment of the pixel shown in FIG. 2.

FIG. 3 is an equivalent circuit diagram illustrating an embodiment of the pixel shown in FIG. 2. For convenience of description, a pixel connected to a jth data line Dj and an ith scan line Si is illustrated in FIG. 3.

Referring to FIGS. 2 and 3, the pixel PXL according to the present embodiment may include an organic light emitting device OLED, a first transistor T1, a second transistor T2, a third transistor T3, a fourth transistor T4, a fifth transistor T5, a sixth transistor T6, a seventh transistor T7, and a storage capacitor Cst.

An anode of the organic light emitting device OLED may be connected to the first transistor T1 via the sixth transistor T6, and a cathode of the organic light emitting device OLED may be connected to the second power source ELVSS. The organic light emitting device OLED may generate light (e.g., with a predetermined luminance) corresponding to the amount of current supplied from the first transistor T1.

The first power source ELVDD may be set to a voltage that is higher than that of the second power source ELVSS such that current can flow in the organic light emitting device OLED.

The seventh transistor T7 may be connected between the initialization power source Vint and the anode of the organic light emitting device OLED. In addition, a gate electrode of the seventh transistor T7 may be connected to the ith scan line Si. The seventh transistor T7 may be turned on when a scan signal is supplied to the ith scan line Si, to supply the voltage of the initialization power source Vint to the anode of the organic light emitting device OLED. Here, the initialization power source Vint may be set to a voltage that is lower than a data signal.

The sixth transistor T6 may be connected between the first transistor T1 and the organic light emitting device OLED. In addition, a gate electrode of the sixth transistor T6 may be connected to an ith emission control line Ei. The sixth transistor T6 may be turned off when an emission control signal is supplied to the ith emission control line Ei, and may be turned on otherwise.

The fifth transistor T5 may be connected between the first power source ELVDD and the first transistor T1. In addition, a gate electrode of the fifth transistor T5 may be connected to the ith emission control line Ei. The fifth transistor T5 may be turned off when the emission control signal is supplied to the ith emission control line Ei, and may be turned on otherwise.

A first electrode of the first transistor (drive transistor) T1 may be connected to the first power source ELVDD via the fifth transistor T5, and a second electrode of the first transistor T1 may be connected to the anode of the organic light emitting device OLED via the sixth transistor T6. In addition, a gate electrode of the first transistor T1 may be connected to a first node N1. The first transistor T1 may control the amount of current flowing from the first power source ELVDD to the second power source ELVSS via the organic light emitting device OLED, corresponding to a voltage of the first node N1. That is, the first power source ELVDD may be electrically connected to the anode of the organic light emitting device OLED through the first transistor T1.

The third transistor T3 may be connected between the second electrode of the first transistor T1 and the first node N1. In addition, a gate electrode of the third transistor T3 may be connected to the ith scan line Si. The third transistor T3 may be turned on when a scan signal is supplied to the ith scan line Si to allow the second electrode of the first transistor T1 to be electrically connected to the first node N1. Therefore, when the third transistor T3 is turned on, the first transistor T1 may be diode-connected, and the third transistor T3 may compensate for a threshold voltage of the first transistor T1. That is, the third transistor T3 may be a compensation transistor that compensates for the threshold voltage of the first transistor T1.

The fourth transistor T4 may be connected between the first node N1 and the initialization power source Vint. In addition, a gate electrode of the fourth transistor T4 may be connected to an (i−1)th scan line Si−1. The fourth transistor T4 may be turned on when a scan signal is supplied to the (i−1)th scan line Si−1, to supply the voltage of the initialization power source Vint to the first node N1.

The second transistor T2 may be connected between the jth data line Dj and the first electrode of the first transistor T1. In addition, a gate electrode of the second transistor T2 may be connected to the ith scan line Si. The second transistor T2 may be turned on when a scan signal is supplied to the ith scan line Si to allow the jth data line Dj to be electrically connected to the first electrode of the first transistor T1.

The storage capacitor Cst may be connected between the first power source ELVDD and the first node N1. The storage capacitor Cst may store a voltage corresponding to the data signal and the threshold voltage of the first transistor T1.

Figure 4:
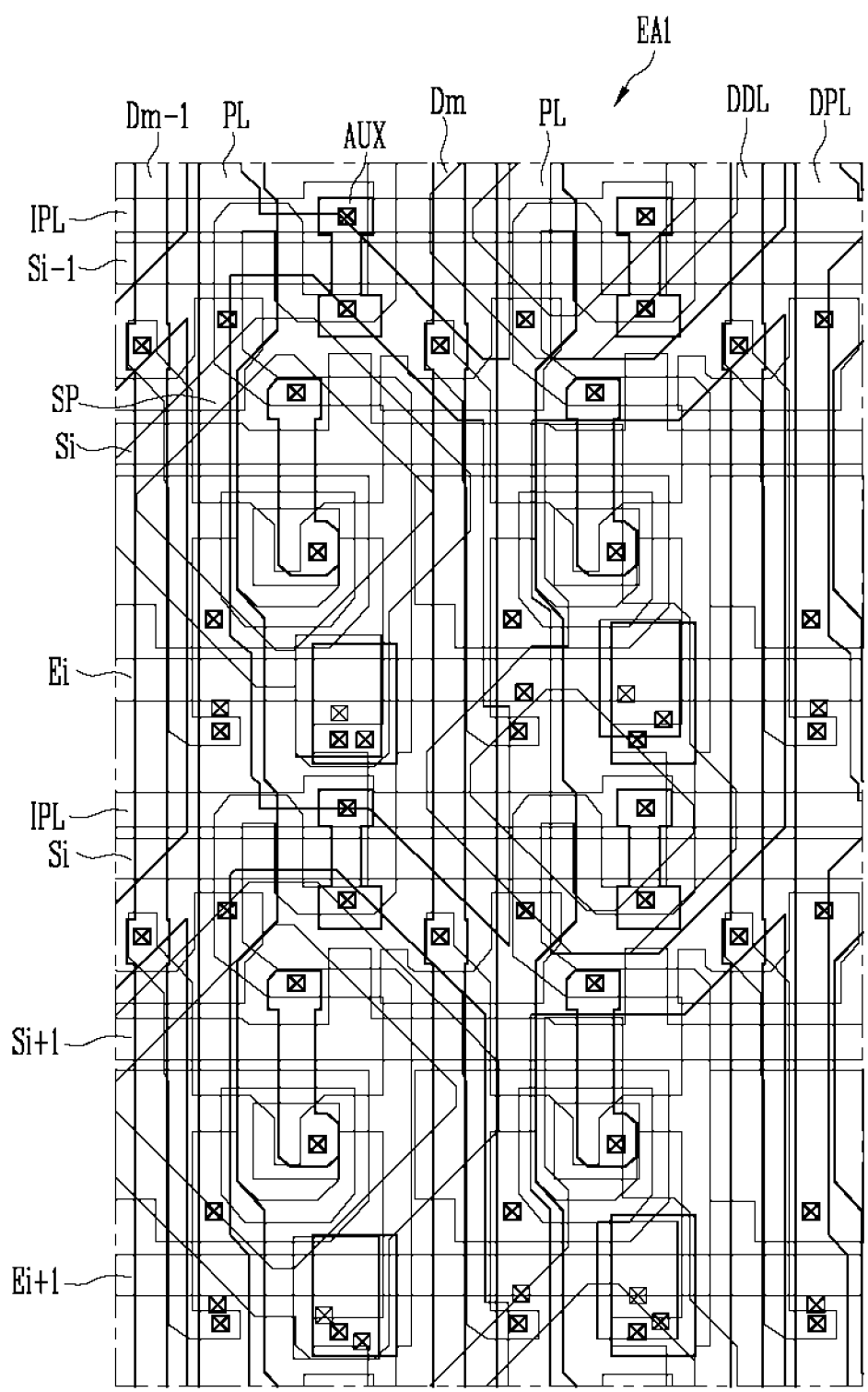
FIG. 4 is an enlarged view of area EA1 of FIG. 1.
Figure 5:
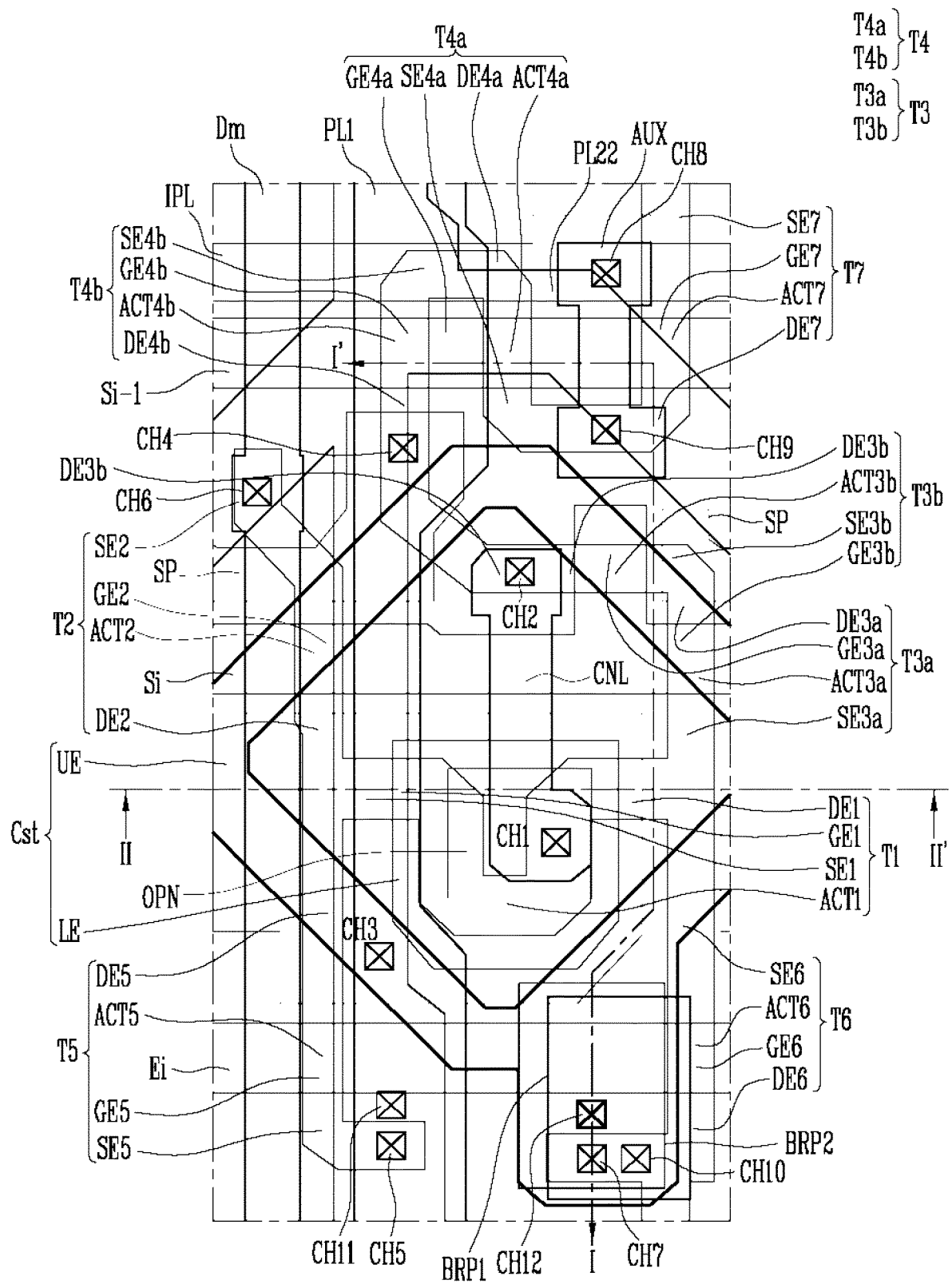
FIG. 5 is an enlarged view of a pixel connected to an ith scan line and an mth data line, which are shown in FIG. 4.
Figure 6:
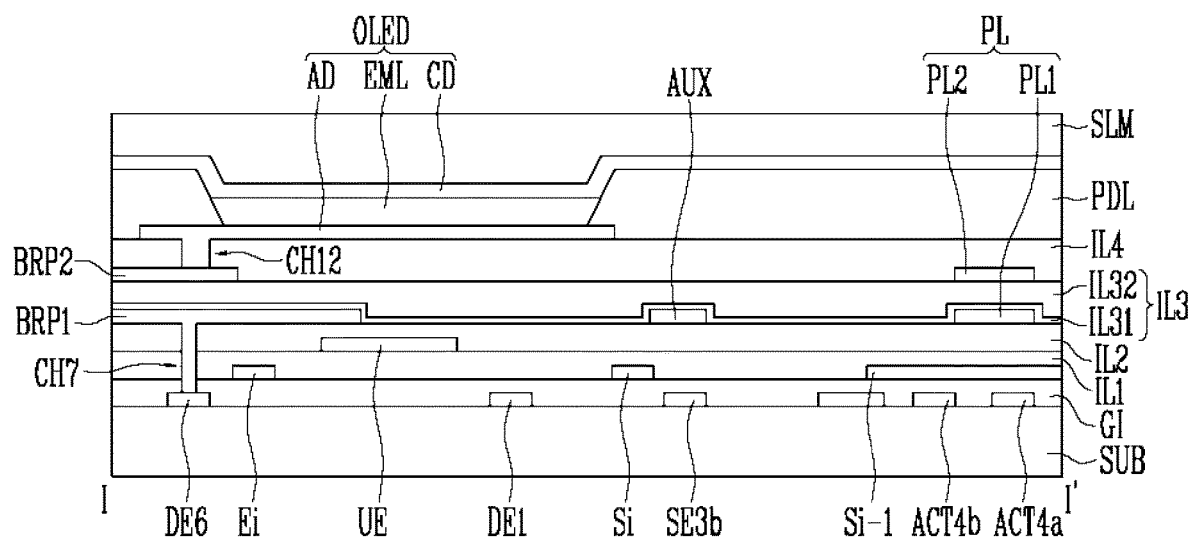
FIG. 6 is a cross-sectional view taken along the line I-I' of FIG. 5.
Figure 7:
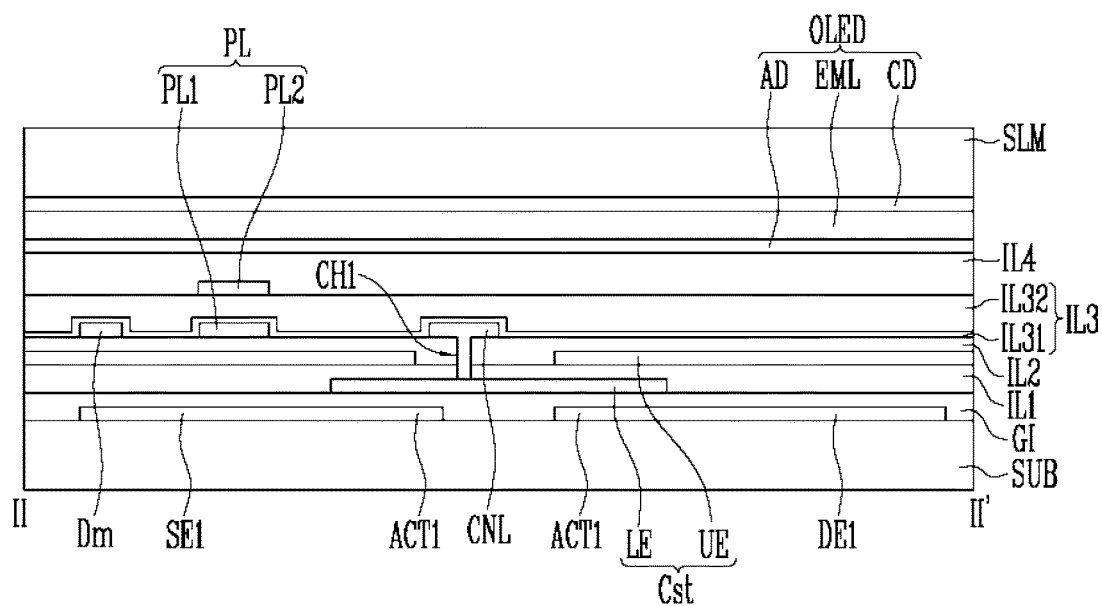
FIG. 7 is a cross-sectional view taken along the line II-II' of FIG. 5.
Figure 8:
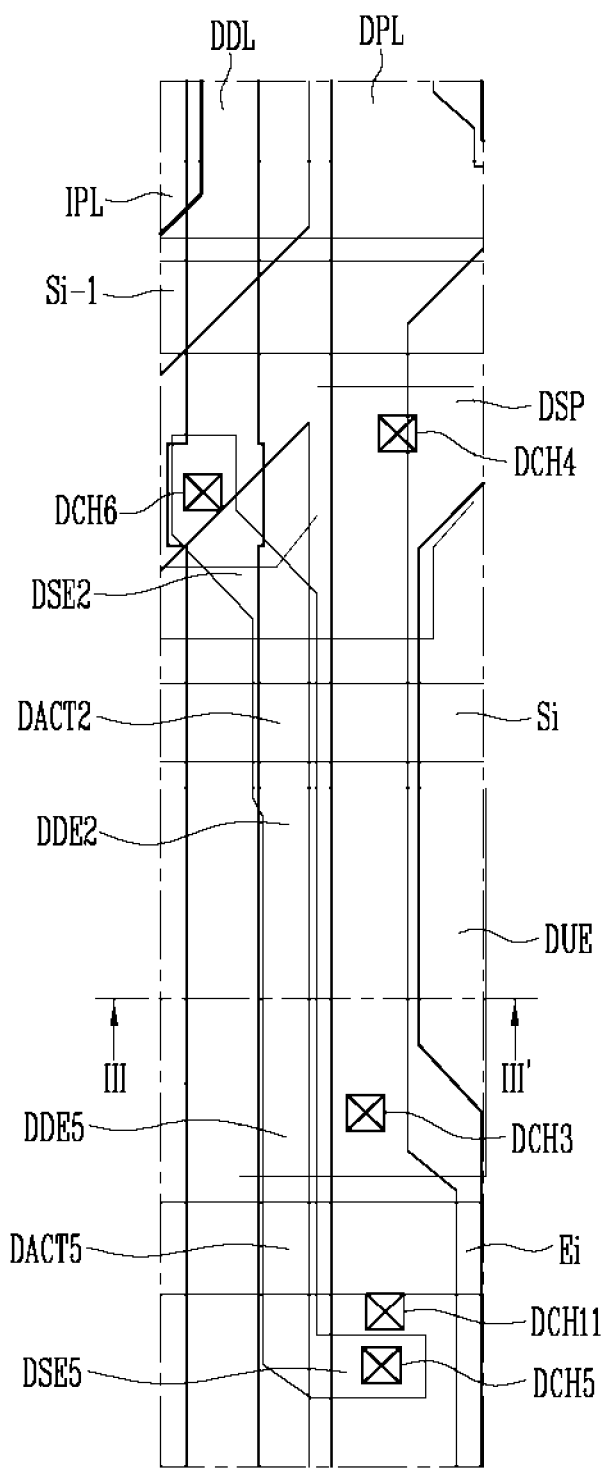
FIG. 8 is an enlarged view of a first dummy part connected to the ith scan line shown in FIG. 4.
Figure 9:
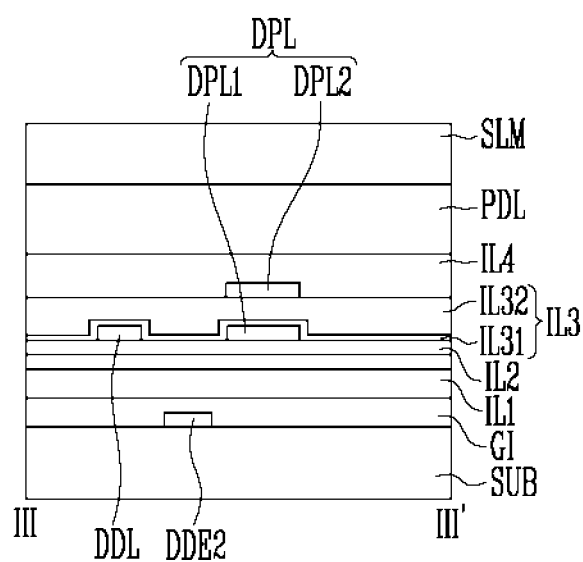
FIG. 9 is a cross-sectional view taken along the line III-III' of FIG. 8.
Figure 10:
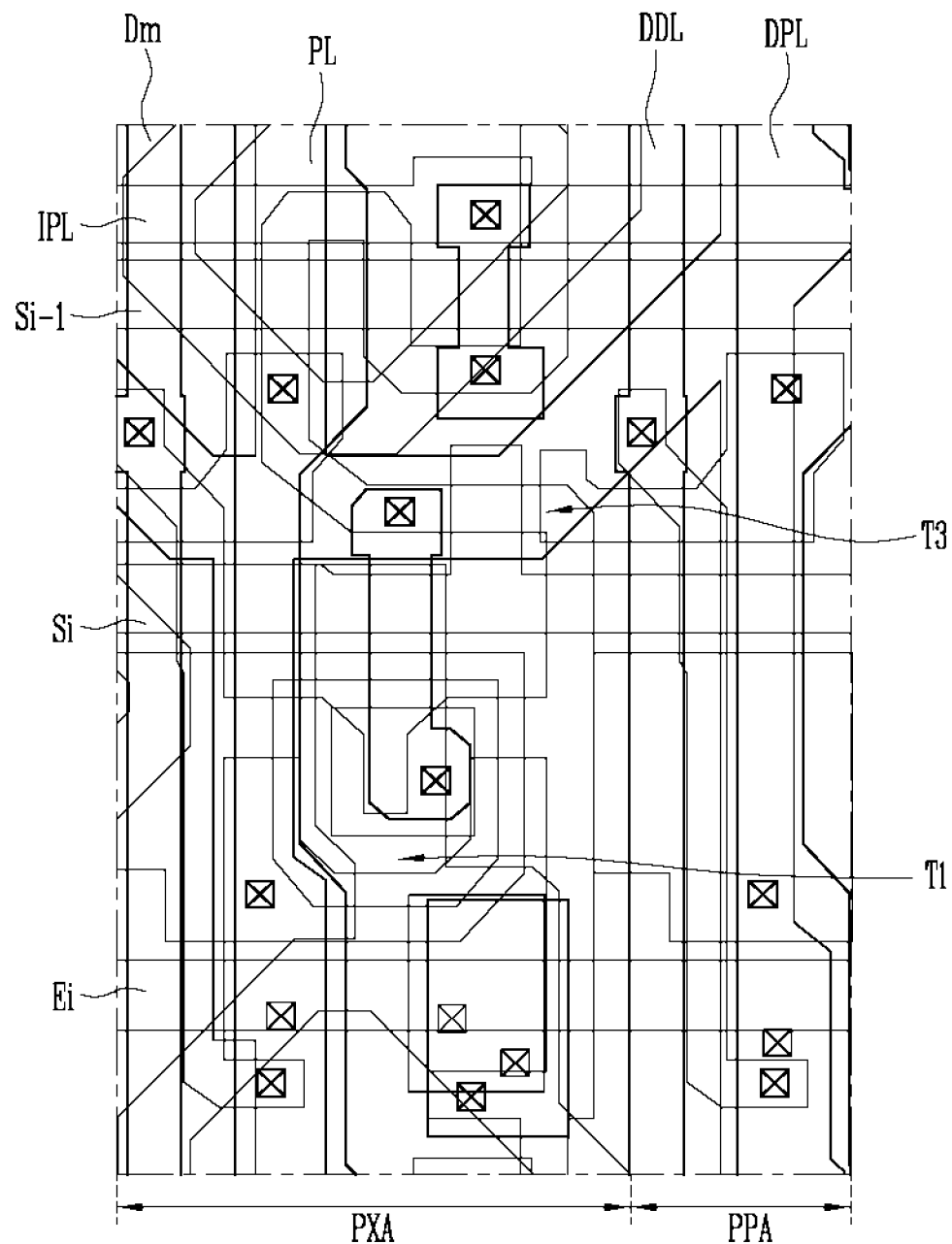
FIGS. 10 and 11 are plan views illustrating an outermost pixel, a data line, and a first dummy part.
Figure 11:
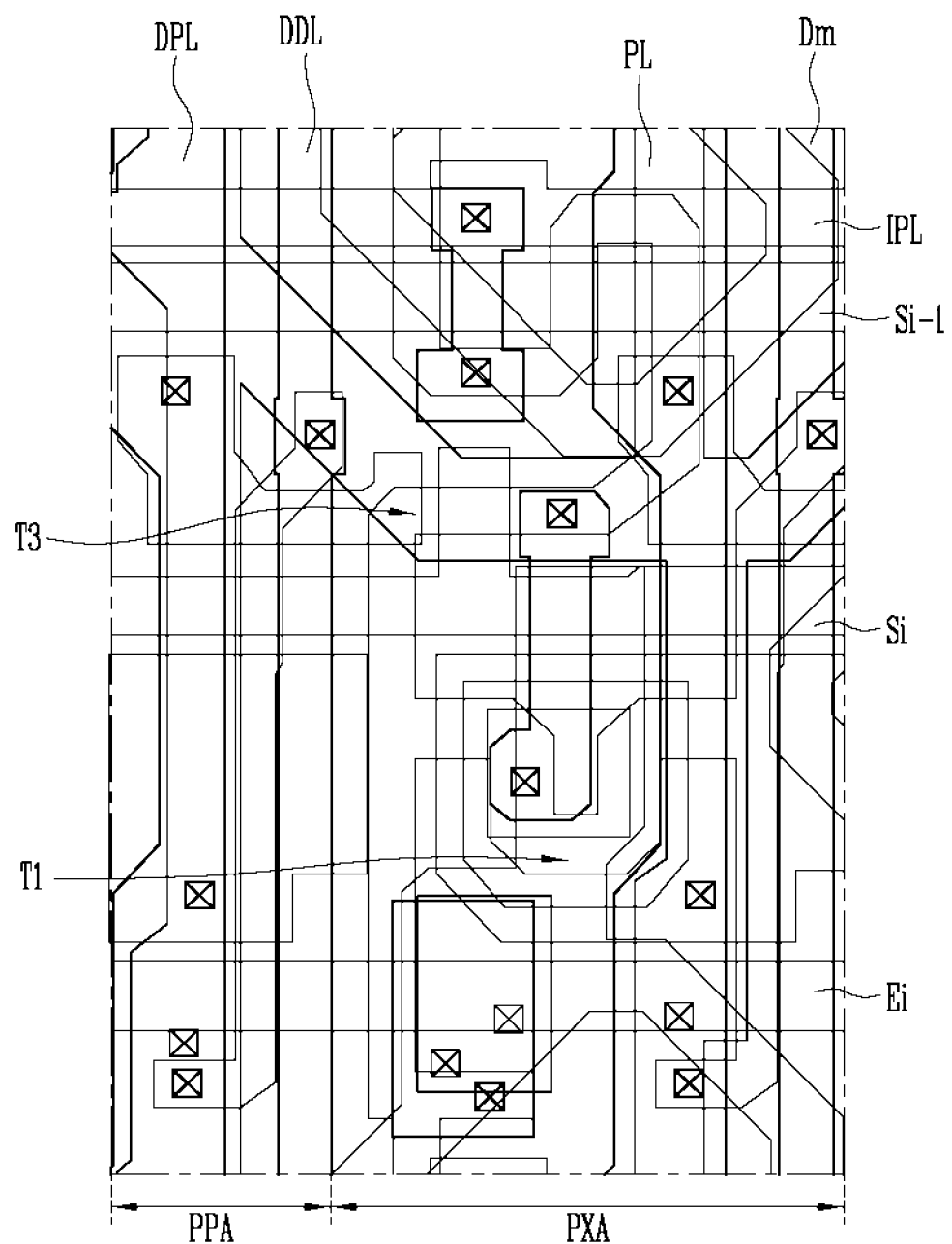

FIG. 4 is an enlarged view of area EA1 of FIG. 1. FIG. 5 is an enlarged view of a pixel connected to an ith scan line and an mth data line, which are shown in FIG. 4. FIG. 6 is a cross-sectional view taken along the line I-I' of FIG. 5. FIG. 7 is a cross-sectional view taken along the line II-II' of FIG. 5. FIG. 8 is an enlarged view of a first dummy part connected to the ith scan line shown in FIG. 4. FIG. 9 is a cross-sectional view taken along the line III-III' of FIG. 8. FIGS. 10 and 11 are plan views illustrating an outermost pixel, a data line, and a first dummy part.

Referring to FIGS. 1 to 11, the display device may include a substrate SUB including a display area PXA and a non-display area PPA, pixels PXL provided in the display area PXA, and a line unit that provides signals to the pixels PXL.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate and a plastic substrate including a polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and may include a fiber reinforced plastic (FRP), etc.

The line unit may provide signals to each of the pixels PXL. The line unit may include scan lines Si−1, Si, and Si+1, data lines Dm−1 and Dm, emission control lines E and Ei+1, a power line PL, and an initialization power line IPL.

The scan lines Si−1, Si, and Si+1 may extend in the first direction DR1. The scan lines Si−1, Si, and Si+1 may have a shape extending from one to the other of portions of the non-display area PPA, which are located at both sides of the display area PXA. The scan lines Si−1, Si, and Si+1 may include an (i−1)th scan line Si−1, an ith scan line Si, and an (i+1)th scan line Si+1, which are sequentially arranged along the second direction DR2. The scan lines Si−1, Si, and Si+1 may be applied with scan signals. For example, the (i−1)th scan line Si−1 may be applied with an (i−1)th scan signal. Pixels PXL connected to the ith scan line Si may be initialized by the (i−1)th scan signal applied to the (i−1)th scan line Si−1. The ith scan line Si may be applied with an ith scan signal. The ith scan line Si may branch off to be connected to different transistors. Pixels PXL connected to the (i+1)th scan line Si+1 may be initialized by the ith scan signal applied to the ith scan line Si. The (i+1)th scan line Si+1 may be applied with an (i+1)th scan signal. The (i+1)th scan line Si+1 may branch off to be connected to different transistors.

The emission control lines Ei and Ei+1 may extend in the first direction DR1. The emission control lines Ei and Ei+1 may have a shape extending from one to the other of portions of the non-display area PPA, which are located at both sides of the display area PXA. The emission control lines Ei and Ei+1 may be located to be spaced apart from the scan lines Si−1, Si, and Si+1. The emission control lines Ei and Ei+1 may be applied with emission control signals.

The data lines Dm−1 and Dm may extend in the second direction DR2. The data lines Dm−1 and Dm may be applied with data signals. Each of the data lines Dm−1 and Dm may be provided at a respective side of corresponding pixels PXL.

The power line PL may have a lattice shape (e.g., a grid or matrix shape). For example, a portion of the power line PL may extend in the second direction DR2, and the rest of the power line PL may extend in a direction crossing the second direction DR2. The power line PL may be applied with the first power source (see "ELVDD" of FIGS. 2 and 3).

The initialization power line IPL may extend along the first direction DR1. The initialization power line IPL may have a shape extending from one to the other of portions of the non-display area PPA, which are located at both sides of the display area PXA. The initialization power line IPL may be located to be spaced apart from the scan lines Si−1, Si, and Si+1. The initialization power line IPL may be applied with the initialization power source Vint.

The pixels PXL may be provided in the display area PXA on the substrate SUB. The pixels PXL may be connected to the scan lines Si−1, Si, and Si+1, the data lines Dm−1 and Dm, the emission control lines Ei and Ei+1, the power line PL, and the initialization power line IPL.

The pixels PXL may include a first pixel, a second pixel, a third pixel, and a fourth pixel. The first pixel may be a pixel connected to the ith scan line Si and an (m−1)th data line Dm−1. The second pixel may be a pixel connected to the ith scan line Si and an mth data line Dm. The third pixel may be a pixel connected to the (i+1)th scan line Si+1 and the (m−1)th data line Dm−1. The fourth pixel may be a pixel connected to the (i+1)th scan line Si+1 and the mth data line Dm.

Each of the pixels PXL may include a first transistor T1, a second transistor T2, a third transistor T3, a fourth transistor T4, a fifth transistor T5, a sixth transistor T6, a seventh transistor T7, a storage capacitor Cst, and an organic light emitting device OLED.

Hereinafter, a second pixel connected to the ith scan line Si and the mth data line Dm will be described in more detail as an example.

The first transistor T1 may include a first gate electrode GE1, the first active pattern ACT1, a first source electrode SE1, a first drain electrode DE1, and a connection line CNL.

The first gate electrode GE1 may be connected to a third drain electrode DE3 of the third transistor T3 and to a fourth drain electrode DE4 of the fourth transistor T4. The connection line CNL may connect between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer that is undoped or doped with impurities. For example, the first source electrode SE1 and the first drain electrode DE1 may be formed of a semiconductor layer that is doped with impurities, and the active pattern ACT1 may be formed of a semiconductor layer that is undoped with impurities.

The first active pattern ACT1 has a bar shape (e.g., a bar shape extending in a predetermined direction), and may have a shape in which it is bent once or more along the extending direction. When viewed on a plane, the first active pattern ACT1 may overlap with the first gate electrode GE1. As the first active pattern ACT1 is formed to be generally long, a channel region of the first transistor T1 can be formed to be generally long. Thus, the driving range of a gate voltage applied to the first transistor T1 can be widened. Accordingly, the gray scale of light emitted from the organic light emitting device OLED can be minutely or precisely controlled.

The first source electrode SE1 may be connected to one end of the first active pattern ACT1. The first source electrode SE1 may be connected to a second drain electrode DE2 of the second transistor T2 and to a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and to a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith scan line Si. The second gate electrode GE2 may be provided as a portion of the ith scan line Si, or may be provided in a shape protruding from the ith scan line Si.

The second active pattern ACT2, the second source electrode SE2, and the second drain electrode DE2 may be formed of a semiconductor layer that is undoped or doped with impurities. For example, the second source electrode SE2 and the second drain electrode DE2 may be formed of a semiconductor layer that is doped with impurities, and the second active pattern ACT2 may be formed of a semiconductor layer that is undoped with impurities. The second active pattern ACT2 may correspond to a portion overlapping with the second gate electrode GE2. One end of the second source electrode SE2 may be connected to the second active pattern ACT2. The other end of the second source electrode SE2 may be connected to the data line Dm through a sixth contact hole CH6. One end of the second drain electrode DE2 may be connected to the second active pattern ACT2. The other end of the second drain electrode DE2 may be connected to the first source electrode SE1 of the first transistor T1 and to the fifth drain electrode DE5 of the fifth transistor T5.

The third transistor T3 may be provided at the opposite side of the first transistor T1 with respect to the data line Dm. That is, with respect to the first transistor T1, the data line Dm may be provided at one side of the first transistor T1, and the third transistor T3 may be provided at the other side of the first transistor T1. For example, as shown in FIG. 10, the data line Dm may be provided at the left side of the first transistor T1, and the third transistor T3 may be provided at the right side of the first transistor T1. In addition, as shown in FIG. 11, the data line Dm may be provided at the right side of the first transistor T1, and the third transistor T3 may be provided at the left side of the first transistor T1.

The third transistor T3 may be provided in a double gate structure so as to reduce or prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3a, a 3bth source electrode SE3b, and a 3bth drain electrode DE3b. Hereinafter, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3ath drain electrode DE3a and the 3bth drain electrode DE3b are referred to as the third drain electrode DE3.

The third gate electrode GE3 may be connected to the ith scan line Si. The third gate electrode GE3 may be provided as a portion of the ith scan line Si, and/or may be provided in a shape protruding from the ith scan line Si. For example, the 3ath gate electrode GE3a may be provided in a shape protruding from the ith scan line Si, and the 3bth gate electrode GE3b may be provided as a portion of the ith scan line Si.

The third active pattern ACT3, the third source electrode SE3, and the third drain electrode DE3 may be formed of a semiconductor layer that is undoped or doped with impurities. For example, the third source electrode SE3 and the third drain electrode DE3 may be formed of a semiconductor layer that is doped with impurities, and the third active pattern ACT3 may be formed of a semiconductor layer that is undoped with impurities. The third active pattern ACT3 may correspond to a portion overlapping with the third gate electrode GE3.

One end of the third source electrode SE3 may be connected to the third active pattern ACT3. The other end of the third source electrode SE3 may be connected to the first drain electrode DE1 of the first transistor T1 and to the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The 3ath source electrode SE3a of the 3ath transistor T3a and the 3bth drain electrode DE3b of the 3bth transistor T3b may be covered by a shielding pattern SP. The shielding pattern SP shields external light incident into the 3ath source electrode SE3a of the 3ath transistor T3a and into the 3bth drain electrode DE3b of the 3bth transistor T3b, thereby reducing or preventing light leakage current that may be generated in the third transistor T3.

The fourth transistor T4 may be provided in a double gate structure so as to reduce or prevent a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as the fourth drain electrode DE4.

The fourth gate electrode GE4 may be connected to the (i−1)th scan line Si−1. The fourth gate electrode GE4 may be provided as a portion of the (i−1)th scan line Si−1, and/or may be provided in a shape protruding from the (i−1)th scan line Si−1. For example, the 4ath gate electrode GE4a may be provided as a portion of the (i−1)th scan line Si−1, and the 4bth gate electrode GE4b may be provided in a shape protruding from the (i−1)th scan line Si−1.

The fourth active pattern ACT4, the fourth source electrode SE4, and the fourth drain electrode DE4 may be formed of a semiconductor layer that is undoped or doped with impurities. For example, the fourth source electrode SE4 and the fourth drain electrode DE4 may be formed of a semiconductor layer that is doped with impurities, and the fourth active pattern ACT4 may be formed of a semiconductor layer that is undoped with impurities. The fourth active pattern ACT4 may correspond to a portion overlapping with the fourth gate electrode GE4.

One end of the fourth source electrode SE4 may be connected to the fourth active pattern ACT4. The other end of the fourth source electrode SE4 may be connected to the initialization power line IPL and to a seventh drain electrode DE7 of the seventh transistor T7. An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to the initialization power line IPL through an eighth contact hole CH8. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the connection line CNL, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line Ei. The fifth gate electrode GE5 may be provided as a portion of the emission control line Ei, or may be provided in a shape protruding from the emission control line Ei.

The fifth active pattern ACT, the fifth source electrode SE5, and the fifth drain electrode DE5 may be formed of a semiconductor layer that is undoped or doped with impurities. For example, the fifth source electrode SE5 and the fifth drain electrode DE5 may be formed of a semiconductor layer that is doped with impurities, and the fifth active pattern ACT5 may be formed of a semiconductor layer that is undoped with impurities. The fifth active pattern ACT5 may correspond to a portion overlapping with the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the emission control line Ei. The sixth gate electrode SE6 may be provided as a portion of the emission control line Ei, or may be provided in a shape protruding from the emission control line Ei.

The sixth active pattern ACT6, the sixth source electrode SE6, and the sixth drain electrode DE6 may be formed of a semiconductor layer that is undoped or doped with impurities. For example, the sixth source electrode SE6 and the sixth drain electrode DE6 may be formed of a semiconductor layer that is doped with impurities, and the sixth active pattern ACT6 may be formed of a semiconductor layer that is undoped with impurities. The sixth active pattern ACT6 may correspond to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7 of a pixel PXL connected to the ith scan line Si.

The seventh transistor T7 may include a seventh gate electrode GE7, a seventh active pattern ACT7, the seventh source electrode SE7, and a seventh drain electrode DE7.

The seventh gate electrode GE7 may be connected to the ith scan line Si. The seventh gate electrode GE7 may be provided as a portion of the ith scan line Si or may be provided in a shape protruding from the ith scan line Si.

The seventh active pattern ACT7, the seventh source electrode SE7, and the seventh drain electrode DE7 may be formed of a semiconductor layer that is undoped or doped with impurities. For example, the seventh source electrode SE7 and the seventh drain electrode DE7 may be formed of a semiconductor layer that is doped with impurities, and the seventh active layer ACT7 may be formed of a semiconductor layer that is undoped with impurities. The seventh active pattern ACT7 may correspond to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6 of a pixel PXL connected to the ith scan line Si. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of the fourth transistor T4. The seventh drain electrode DE7 and the fourth source electrode SE4 of the fourth transistor T4 may be connected to the initialization power line IPL through the auxiliary connection line AUX, the eighth contact hole CH8, and the ninth contact hole CH9.

The storage capacitor Cst may include a lower electrode LE and an upper electrode UE. The lower electrode LE may be configured as (e.g., as a portion of) the first gate electrode GE1 of the first transistor T1.

When viewed on a plane, the upper electrode UE overlaps with the first gate electrode GE1, and may cover the lower electrode LE. As the overlapping area of the upper electrode UE and the lower electrode LE is widened, the capacitance of the storage capacitor Cst may be increased. In an embodiment of the present disclosure, the upper electrode UE may be connected to the power line PL through a third contact hole CH3. Therefore, a voltage having the same level as the first power source ELVDD may be applied to the upper electrode UE. The upper electrode UE may have an opening OPN in a region including the first contact hole CH1 through which the first gate electrode GE1 and the connection line CNL are in contact with each other.

The organic light emitting device OLED may include a first electrode AD, a second electrode CD, and an emitting layer EML provided between the first electrode AD and the second electrode CD.

The first electrode AD may be provided in a light emitting area corresponding to each pixel PXL. The first electrode AD may be connected to the sixth drain electrode DE6 of the sixth transistor T6 through a seventh contact hole CH7, a tenth contact hole CH10, and a twelfth contact hole CH12. A first bridge pattern BRP1 may be provided between the seventh contact hole CH7 and the tenth contact hole CH10. A second bridge pattern BRP2 may be provided between the tenth contact hole CH10 and the twelfth contact hole CH12.

The first bridge pattern BRP1 and the second bridge pattern BRP2 may connect the sixth drain electrode DE6 to the first electrode AD.

In the present embodiment, the second pixel is described as an example, but the first pixel, the third pixel, and the fourth pixel may have a structure that is similar to that of the second pixel. However, respective data lines, scan lines, and emission control lines, which are connected to the first pixel, the third pixel, and the fourth pixel, are different from those of the second pixel.

A first dummy part may be provided at one portion of the non-display area PPA on the substrate SUB. For example, the first dummy part may be provided at the longitudinal part of the non-display area PPA adjacent to a pixel PXL at an outermost portion (hereinafter referred to as an "outermost pixel"). That is, the first dummy part may be provided at the opposite side of the outermost pixel(s) PXL with respect to an outermost data line Dm. For example, the first dummy part may be provided in the non-display area PPA adjacent to a third transistor T3 of the outermost pixel PXL.

In addition, the distance between the first dummy part and the third transistor T3 of the outermost pixel PXL may be less than that between the third transistor T3 of the outermost pixel PXL and the outermost data line Dm.

In the first direction, the width of the first dummy part may be less than that of each pixel PXL. The first dummy part may have a shape similar to that of one portion of the outermost pixel PXL. In more detail, the first dummy part may include a dummy semiconductor pattern, a dummy shielding pattern DSP, a dummy upper electrode pattern DUE, a dummy data line DDL, and a dummy power pattern DPL.

The dummy semiconductor pattern may have a shape extending in a direction parallel to the dummy data line DDL. The dummy semiconductor pattern may include a dummy second source electrode DSE2, a dummy second active pattern DACT2, a dummy second drain electrode DDE2, a dummy fifth source electrode DSE5, a dummy fifth active pattern DACT5, and a dummy fifth drain electrode DDE5. Here, the dummy second source electrode DSE2 may have a shape identical or similar to that of the second source electrode SE2. The dummy second active pattern DACT2 may have a shape identical or similar to that of the second active pattern ACT2. The dummy second drain electrode DDE2 may have a shape identical or similar to that of the second drain electrode DE2. The dummy fifth source electrode DSE5 may have a shape identical or similar to that of the fifth source electrode SE5. The dummy fifth active pattern DACT5 may have a shape identical or similar to that of the fifth active pattern ACT5. The dummy fifth drain electrode DDE5 may have a shape identical or similar to that of the fifth drain electrode DE5.

The dummy shielding pattern DSP may have a shape identical or similar to the shielding pattern SP. Like the shielding pattern SP, the dummy shielding pattern DSP may cover at least a portion of the third transistor T3 of the outermost pixel PXL.

For example, in the outermost pixel PXL, a 3ath source electrode SE3$a$ of a 3ath transistor T3$a$, and a 3bth drain electrode SE3$b$ of a 3bth transistor T3$b$, may be covered by the dummy shielding pattern DSP. The dummy shielding pattern DSP may be electrically connected to the dummy power pattern DPL.

The dummy upper electrode pattern DUE may have a shape similar to that of the upper electrode UE with the exception of the opening OPN.

The dummy data line DDL may have a shape identical or similar to that of the outermost data line Dm. The dummy data line DDL may be connected to the dummy second source electrode DSE2 through a dummy sixth contact hole DCH6.

The dummy power pattern DPL may have a shape identical or similar to that of the power line PL. The dummy power pattern DPL may be connected to the power line PL. Therefore, the first power source ELVDD may be supplied to the dummy power pattern DPL.

The first dummy part may form a parasitic capacitor with the outermost pixel PXL. For example, the first dummy part may form a parasitic capacitor with a first drain electrode DE1 of a first transistor T1, the third transistor T3, and a sixth transistor T6 of the outermost pixel PXL. For example, the first dummy part may form a parasitic capacitor with the 3ath transistor T3a of the outermost pixel PXL. Also, the first dummy part may form a parasitic capacitor with the first drain electrode DE of the first transistor T1 of the outermost pixel PXL. If a parasitic capacitor is formed between the outermost pixel PXL and the first dummy part, it is possible to reduce or prevent the luminance of the outermost pixel PXL from being lowered.

In general, the pixel PXL in the display area PXA forms a parasitic capacitor with the data lines Dm−1 and Dm and the power line PL, which are adjacent thereto. For example, the first drain electrode DE1 of the first transistor T1, the third transistor T3, and the sixth transistor T6 may form a parasitic capacitor with the data lines Dm−1 and Dm adjacent thereto. The parasitic capacitance may have influence on current applied to the organic light emitting device OLED in the pixel PXL.

Meanwhile, when the first dummy part does not exist, the data lines and the power line (e.g., the dummy data line DDL and the dummy power pattern DPL), which are adjacent to the outermost pixel PXL, do not exist. Therefore, the outermost pixel PXL cannot form a parasitic capacitor with the data lines and the power line, which are adjacent thereto. Accordingly, the luminance of an outermost pixel PXL among pixels PXL connected to one of the scan lines Si−1, Si, and Si+1 (e.g., the ith scan line Si) may be different from that of the other pixels PXL.

However, in the present embodiment, the outermost pixel PXL can form a parasitic capacitor with the first dummy part. Thus, the luminance of the outermost pixel PXL among the pixels PXL connected to one of the scan lines Si−1, Si, and Si+1 (e.g., the ith scan line Si) can be equal or similar to that of the other pixels PXL. That is, it is possible to reduce or prevent a difference in luminance from occurring between the outermost pixels PXL and the other pixels PXL among the pixels PXL connected to the ith scan line Si.

Hereinafter, a structure of the second pixel according to the present embodiment will be described along a stacking order with reference to FIGS. 4 to 9.

A semiconductor pattern may be provided on the substrate SUB including the display area PXA and the non-display area PPA. The semiconductor pattern may be provided corresponding to an area in which each pixel PXL of the display area PXA is located. The semiconductor pattern may include the first to seventh active patterns ACT1 to ACT7, the first to seventh source electrodes SE1 to SE7, the first to seventh drain electrodes DE1 to DE7, and the dummy semiconductor pattern. The semiconductor pattern may include a semiconductor material.

A buffer layer may be provided between the substrate SUB and the semiconductor pattern.

The buffer layer may reduce or prevent impurities from being diffused into the first to seventh active patterns ACT1 to ACT7 from the substrate SUB. The buffer layer may be provided in a single layer, or may be provided in a multi-layer including at least two layers. The buffer layer may include at least one of an organic insulating layer and an inorganic insulating layer. The organic insulating layer may include an organic insulating material that enables light to be transmitted therethrough. The inorganic insulating layer may include at least one of silicon oxide, silicon nitride, and silicon oxynitride. When the buffer layer is provided as a multi-layer, the layers may include the same material, or may include different materials. For example, the inorganic insulating layer may include a first layer including silicon oxide, and a second layer that is located on the first layer and includes silicon nitride.

A gate insulating layer GI may be provided on the substrate SUB having the semiconductor pattern formed thereon. The gate insulating layer GI may include at least one of an organic insulating layer and an inorganic insulating layer. The organic insulating layer may include an organic insulating material that enables light to be transmitted therethrough. For example, the organic insulating layer may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin. The inorganic insulating layer may include at least one of silicon oxide, silicon nitride, and silicon oxynitride.

The (i−1)th scan line Si−1, the ith scan line Si, the (i+1)th scan line Si+1, the ith emission control line Ei, the (i+1)th emission control line Ei+1, and the first to seventh gate electrodes GE1 to GE7 may be provided on the gate insulating layer GI. The first gate electrode GE1 may become, or may form part of, the lower electrode LE of the storage capacitor Cst. The second gate electrode GE2 and the third gate electrode GE3 may be integrally formed with the ith scan line Si. The fourth gate electrode GE4 and the seventh gate electrode GE7 may be integrally formed with the (i−1)th scan line. The fifth gate electrode GE5 and the sixth gate electrode GE6 may be integrally formed with the ith emission control line Ei.

The (i−1)th scan line Si−1, the ith scan line Si, the (i+1)th scan line Si+1, the ith emission control line Ei, and the (i+1)th emission control line Ei+1 may have a shape extending to the non-display area PPA adjacent to the outermost pixel PXL.

The (i−1)th scan line Si−1, the ith scan line Si, the (i+1)th scan line Si+1, the ith emission control line Ei, the (i+1)th emission control line Ei+1, and the first to seventh gate electrodes GE1 to GE7 may include a metallic material. For example, the (i−1)th scan line Si−1, the ith scan line Si, the (i+1)th scan line Si+1, the ith emission control line Ei, the (i+1)th emission control line Ei+1, and the first to seventh gate electrodes GE1 to GE7 may include at least one of gold (Au), silver (Ag), aluminum (Al), molybdenum (Mo), chromium (Cr), titanium (Ti), nickel (Ni), neodymium (Nd), copper (Cu), and any alloy thereof. The (i−1)th scan line Si−1, the ith scan line Si, the (i+1)th scan line Si+1, the ith emission control line Ei, the (i+1)th emission control line Ei+1, and the first to seventh gate electrodes GE1 to GE7 may be formed in a single layer, but the present disclosure is not limited thereto. For example, the (i−1)th scan line Si−1, the ith scan line Si, the (i+1)th scan line Si+1, the ith emission control line Ei, the (i+1)th emission control line Ei+1, and the first to seventh gate electrodes GE1 to GE7 may be formed in a multi-layer in which two or more layers are stacked, which include at least one of gold (Au), silver (Ag), aluminum (Al), molybdenum (Mo), chromium (Cr), titanium (Ti), nickel (Ni), neodymium (Nd), copper (Cu), and any alloy thereof.

A first interlayer insulating layer IL1 may be provided on the substrate SUB on which the (i−1)th scan line Si−1, the ith scan line Si, the (i+1)th scan line Si+1, the ith emission control line Ei, the (i+1)th emission control line Ei+1, the first to seventh gate electrodes GE1 to GE7, and the like are formed. The first interlayer insulating layer IL1 may include at least one of polysiloxane, silicon oxide, silicon nitride, and silicon oxynitride.

The upper electrode UE of the storage capacitor Cst, the shielding pattern SP, the initialization power line IPL, the dummy shielding pattern DSP, and the dummy upper electrode pattern DUE may be provided on the first interlayer insulating layer IL1. The upper electrode UE may cover the lower electrode LE. The upper electrode UE along with the lower electrode LE may constitute the storage capacitor Cst with the first interlayer insulating layer IL1 interposed therebetween. The upper electrode UE, the shielding pattern SP, the initialization power line IPL, the dummy shielding pattern DSP, and the dummy upper electrode pattern DUE may be formed in a single layer or in multi-layer including at least one of gold (Au), silver (Ag), aluminum (Al), molybdenum (Mo), chromium (Cr), titanium (Ti), nickel (Ni), neodymium (Nd), copper (Cu), and any alloy thereof.

The initialization power line IPL may have a shape extending to the non-display area PPA adjacent to the outermost pixel PXL.

The shielding pattern SP may overlap with at least a portion of the third transistor T3. For example, the shielding pattern SP may cover the 3ath source electrode SE3$a$ of the 3ath transistor T3$a$, and the 3bth drain electrode DE3$b$ of the 3bth transistor T3$b$. The shielding pattern SP blocks external light incident into the 3ath source electrode SE3$a$ of the 3ath transistor T3$a$ and into the 3bth drain electrode DE3$b$ of the 3bth transistor T3$b$, thereby reducing or preventing light leakage current that may be generated in the third transistor T3.

A second interlayer insulating layer IL2 may be provided on the substrate SUB on which the upper electrode UE, the shielding pattern SP, the initialization power line IPL, the dummy shielding pattern DSP, and the dummy upper electrode pattern DUE are located.

The second interlayer insulating layer IL2 may include at least one of an inorganic insulating layer and an organic insulating layer. For example, the second interlayer insulating layer IL2 may include at least one inorganic insulating layer. The inorganic insulating layer may include at least one of silicon oxide, silicon nitride, and silicon oxynitride. Also, the second interlayer insulating layer IL2 may include at least one organic insulating layer. The organic insulating layer may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin. Also, the second interlayer insulating layer IL2 may have a multi-layered structure including at least one inorganic insulating layer and at least one organic insulating layer.

A first conductive pattern may be provided on the second interlayer insulating layer IL2. The first conductive pattern may include the data lines Dm−1 and Dm, the connection line CNL, the auxiliary connection line AUX, the first bridge pattern BRP1, a first power supply line PL1 of the power line PL, the dummy data line DDL, and a dummy first power line DPL1.

The data lines Dm−1 and Dm may be connected to the respective second source electrode SE2 through the sixth contact hole CH6 passing through the gate insulating layer GI, the first interlayer insulating layer IL1, and the second interlayer insulating layer IL2.

One end of the connection line CNL may be connected to the first gate electrode GE1 through the first contact hole CH1 passing through the first interlayer insulating layer IL1 and the second interlayer insulating layer IL2. In addition, the other end of the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The auxiliary connection line AUX may be connected to the initialization power line IPL through the eighth contact hole CH8 passing through the second interlayer insulating layer IL2. Also, the auxiliary connection line AUX may be connected to the fourth source electrode SE4 and the seventh drain electrode DE7 through the ninth contact hole CH9 passing through the gate insulating layer GI, the first interlayer insulating layer IL1, and the second interlayer insulating layer IL2.

The first bridge pattern BRP1 along with the second bridge pattern BRP2 may be a pattern provided as a medium connecting the sixth drain electrode DE6 to the first electrode AD between the sixth drain electrode DE6 and the first electrode AD. The first bridge pattern BRP1 may be connected to the sixth drain electrode DE6 through the seventh contact hole CH7 passing through the gate insulating layer GI, the first interlayer insulating layer IL1, and the second interlayer insulating layer IL2.

The first power supply line PL1 may have a shape extending in one direction. The first power supply line PL1 may be connected to the fifth source electrode SE5 through the fifth contact hole CH5 passing through the gate insulating layer GI, the first interlayer insulating layer IL1, and the second interlayer insulating layer IL2. Also, the first power supply line PL1 may be connected to the upper electrode UE through the third contact hole CH3 passing through the second interlayer insulating layer IL2.

The first power supply line PL1 may be electrically connected to the shielding pattern SP through a fourth contact hole CH4 passing through the second interlayer insulating layer IL2. Therefore, the shielding pattern SP may be applied with the same power source as the power line PL. That is, the first power source ELVDD may be applied to the shielding pattern SP.

In addition, the shielding pattern SP of each pixel PXL may be connected to the first power supply line PL1 of an adjacent pixel PXL in a direction toward the outermost pixel PXL.

The dummy data line DDL may extend in parallel to the data lines Dm−1 and Dm. The dummy data line DDL may have a shape identical or similar to that of the data lines Dm−1 and Dm. The dummy data line DDL may be connected to the dummy second source electrode DSE2 through the dummy sixth contact hole DCH6 passing through the gate insulating layer GI, the first interlayer insulating layer IL1, and the second interlayer insulating layer IL2.

The dummy first power line DPL1 may have a shape identical or similar to that of the first power supply line PL1. The dummy first power line DPL1 may be connected to the dummy upper electrode pattern DUE and the dummy shielding pattern DSP through a dummy third contact hole DCH3 and a dummy fourth contact hole DCH4, which pass through the second interlayer insulating layer IL2. The dummy first power line DPL1 may be connected to the dummy fifth source electrode DSE5 through a dummy fifth contact hole DCH5 passing through the gate insulating layer GI, the first interlayer insulating layer IL1, and the second interlayer insulating layer IL2.

A third interlayer insulating layer IL3 may be provided on the substrate having the first conductive pattern provided thereon. The third interlayer insulating layer IL3 may include a first insulating layer IL31 provided on the substrate SUB having the first conductive pattern provided thereon, and a second insulating layer IL32 provided on the first insulating layer IL31. The first insulating layer IL31 may include an inorganic insulating material. For example, the first insulating layer IL31 may include at least one of polysiloxane, silicon oxide, silicon nitride, and silicon oxynitride. For example, the second insulating layer IL32 may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin.

A second conductive pattern may be provided on the third interlayer insulating layer IL3. The second conductive pattern may include a second power supply line PL2 of the power line PL, the second bridge pattern BRP2, and a dummy second power line DPL2. The second bridge pattern BRP2 may be connected to the first bridge pattern BRP1 through the tenth contact hole CH10 passing through the first insulating layer IL31 and the second insulating layer IL32.

The second power supply line PL2 may have a shape in which at least a portion of the second power supply line PL2 overlaps with the first power supply line PL1. For example, the second power supply line PL2 may include first lines extending in parallel to the first power supply line PL1 and second lines extending in a direction crossing the first lines. Therefore, the second lines may allow adjacent first lines to be electrically connected to each other therethrough.

Because the first lines and the second lines cross each other, the second power supply line PL2 may have a lattice or mesh shape. The first lines of the second power supply line PL2 may be connected to the first power supply line PL1 through an eleventh contact hole CH11 passing through the first insulating layer IL31 and the second insulating layer IL32. Therefore, the power line PL may include the first power supply line PL1 and the second power supply line PL2.

The power line PL includes the first power supply line PL1 and the second power supply line PL2, and the second power line PL2 has the lattice or mesh shape, so that, although a portion of the first power supply line PL1 or the second power supply line PL2 is opened, the first power source ELVDD supplied to the power line PL can detour to be supplied to each pixel PXL. Thus, it is possible to reduce or prevent the generation of a dark spot as the first power supply line PL1 or the second power supply line PL2 is opened (e.g., electrically opened, or disconnected).

In addition, the power line PL includes the first power supply line PL1 and the second power supply line PL2, and the second power line PL2 has the lattice or mesh shape, so that a voltage drop of the first power source ELVDD can be reduced or prevented. If the voltage drop of the first power source ELVDD is reduced or prevented, the pixels PXL can be supplied with substantially uniform first power source ELVDD, and accordingly, it is possible to reduce or prevent the quality of the display device from being degraded.

The dummy second power line DPL2 may have a shape identical or similar to that the first lines of the second power supply line PL2. The dummy second power line DPL2 may be connected to the second lines. Therefore, the dummy second power line DPL2 may be applied with the first power source ELVDD.

The dummy second power line DPL2 may be connected to the dummy first power line DPL1 through a dummy eleventh contact hole DCH11. Therefore, the dummy power pattern DPL may include the dummy first power line DPL1 and the dummy second power line DPL2. Because the dummy second power line DPL2 is connected to the dummy first power line DPL1, the dummy first power line DPL1 may be supplied with the first power source ELVDD, and the dummy shielding pattern DSP connected to the dummy first power line DPL1 may also be supplied with the first power source ELVDD.

A fourth interlayer insulating layer IL4 may be provided on the third interlayer insulating layer IL3 having the second conductive pattern provided thereon.

The fourth interlayer insulating layer IL4 may include an organic insulating material. For example, the fourth interlayer insulating layer IL4 may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin.

The organic light emitting device OLED may be provided on the fourth interlayer insulating layer IL4. The organic light emitting device OLED may include the first electrode AD, the second electrode CD, and the emitting layer EML provided between the first electrode AD and the second electrode CD.

The first electrode AD may be provided on the fourth interlayer insulating layer IL4. The first electrode AD may be connected to the second bridge pattern BRP through the twelfth contact hole CH12 passing through the fourth interlayer insulating layer IL4. Therefore, the first electrode AD may be electrically connected to the first bridge pattern BRP1. Because the first bridge pattern BRP1 is connected to the sixth drain electrode DE6 through the seventh contact hole CH7, the first electrode AD may be electrically connected to the sixth drain electrode DE6.

A pixel defining layer PDL defining a light emitting area to correspond to each pixel PXL may be provided on the fourth interlayer insulating layer IL4 having the first electrode AD formed thereon. The pixel defining layer PDL may expose a top surface of the first electrode AD therethrough. The exposed area of the first electrode AD may be a light emitting area.

The pixel defining layer PDL may include an organic insulating material. For example, the pixel defining layer PDL may include at least one of polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

The emitting layer EML may be provided in the light emitting area on the first electrode AD, and the second electrode CD may be provided on the emitting layer EML. An encapsulation layer SLM covering the second electrode CD may be provided on the second electrode CD.

One of the first electrode AE and the second electrode CE may be an anode, and the other may be a cathode. For example, the first electrode AE may be an anode and the second electrode CE may be a cathode.

In addition, at least one of the first electrode AD and the second electrode CD may be a transmissive electrode. For example, when the organic light emitting device OLED is a bottom-emission organic light emitting device, the first electrode AD may be a transmissive electrode, and the second electrode CD may be a reflective electrode. When the organic light emitting device OLED is a top-emission organic light emitting device, the first electrode AD may be a reflective electrode, and the second electrode CD may be a transmissive electrode. When the organic light emitting device OLED is a dual-emission light emitting device, both of the first electrode AD and the second electrode CD may be transmissive electrodes. In this embodiment, a case where the organic light emitting device OLED is a top-emission organic light emitting device, and the first electrode AD is an anode electrode is described as an example.

The first electrode AD may include a reflective layer, which is capable of reflecting light, and a transparent conductive layer that is located on the top or bottom of the reflective layer. At least one of the transparent conductive layer and the reflective layer may be electrically connected to the sixth drain electrode DE6.

The reflective layer may include a material capable of reflecting light. For example, the reflective layer may include at least one of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The emitting layer EML may be located on the light emitting area of the first electrode AD. The emitting layer EML may have a multi-layered thin film structure at least including a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons. In the emitting layer EML, the HIL, HTL, HBL, ETL, and EIL may be common layers commonly located in pixels PXL adjacent to each other.

The second electrode CD may be a semi-transmissive reflective layer. For example, the second electrode CD may be a thin metal layer having a thickness, through which light emitted through the emitting layer EML can be transmitted. The second electrode CD may transmit a portion of the light emitted from the emitting layer EML therethrough, and may reflect the rest of the light emitted from the emitting layer EML.

The second electrode CD may include a material having a work function that is lower than that of the transparent conductive layer. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the organic light emitting device OLED can be improved by the resonance of the light.

The distance between the reflective layer and the second electrode CD may be changed depending on a color of the light emitted from the emitting layer EML. That is, the distance between the reflective layer and the second electrode CD may be adjusted to satisfy constructive interference of the light emitted from the emitting layer EML, depending on a color of the light emitted from the emitting layer EML.

The encapsulation layer SLM can reduce or prevent oxygen and moisture from infiltrating into the organic light emitting device OLED. The encapsulation layer SLM may include a plurality of inorganic layers and a plurality of organic layers. For example, the encapsulation layer SLM may include a plurality unit encapsulation layers including the inorganic layer and the organic layer located on the inorganic layer. In addition, the inorganic layer may be located at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide.

Figure 12:
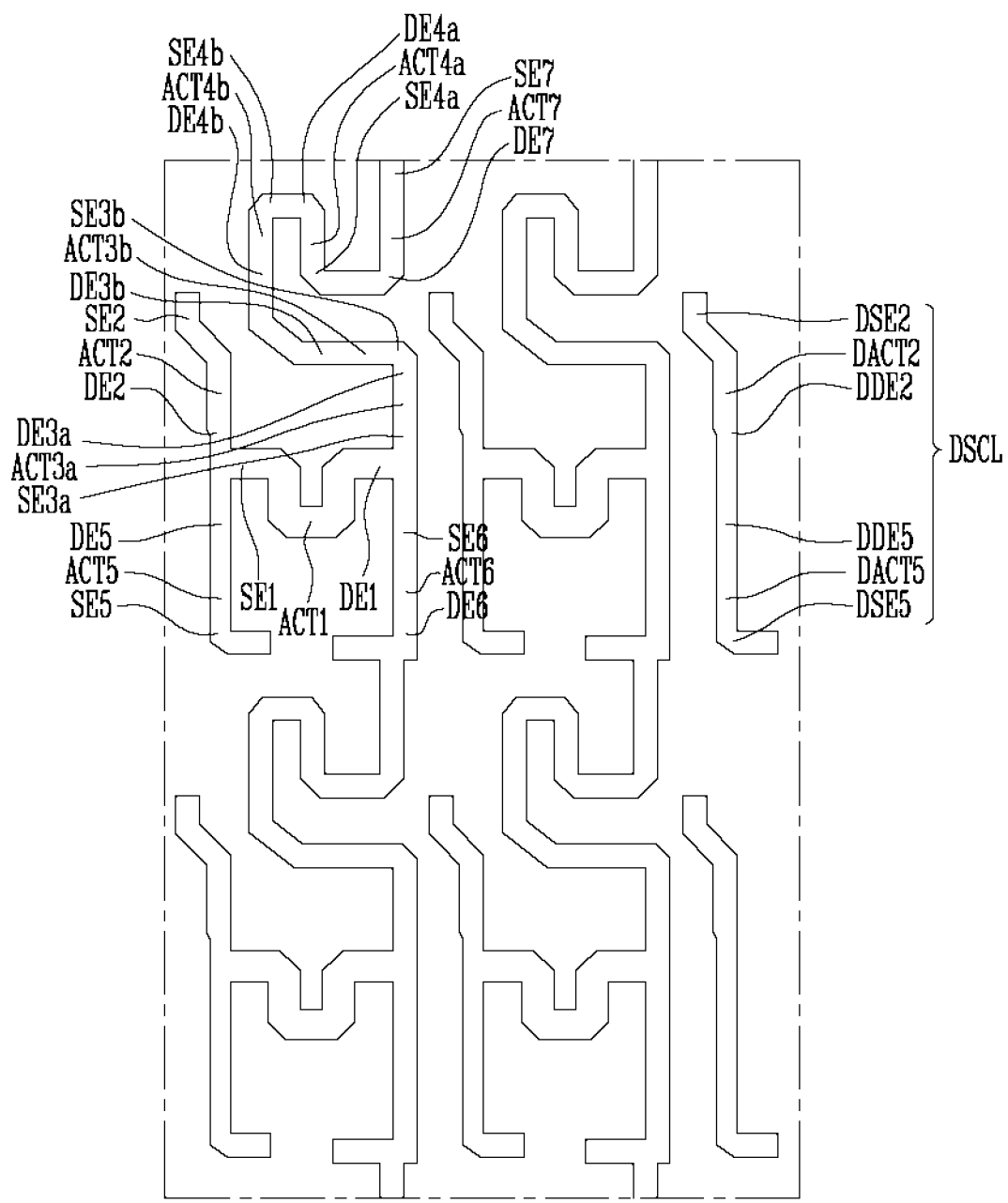
FIG. 12 is a plan view illustrating active patterns, source electrodes, and drain electrodes, which are shown in FIGS. 4 to 10.
Figure 13:
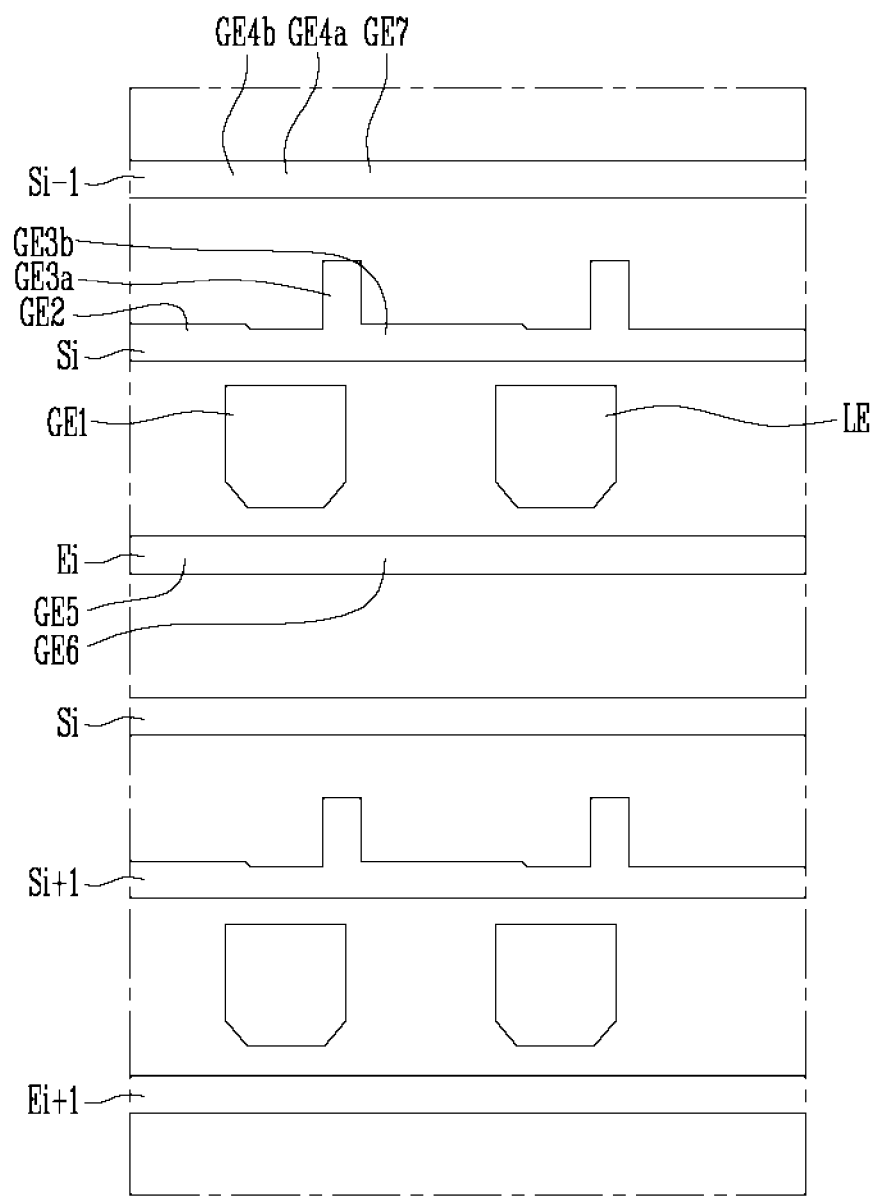
FIG. 13 is a plan view illustrating scan lines, emission control lines, and a lower electrode of a storage capacitor, which are shown in FIGS. 4 to 10.
Figure 14:
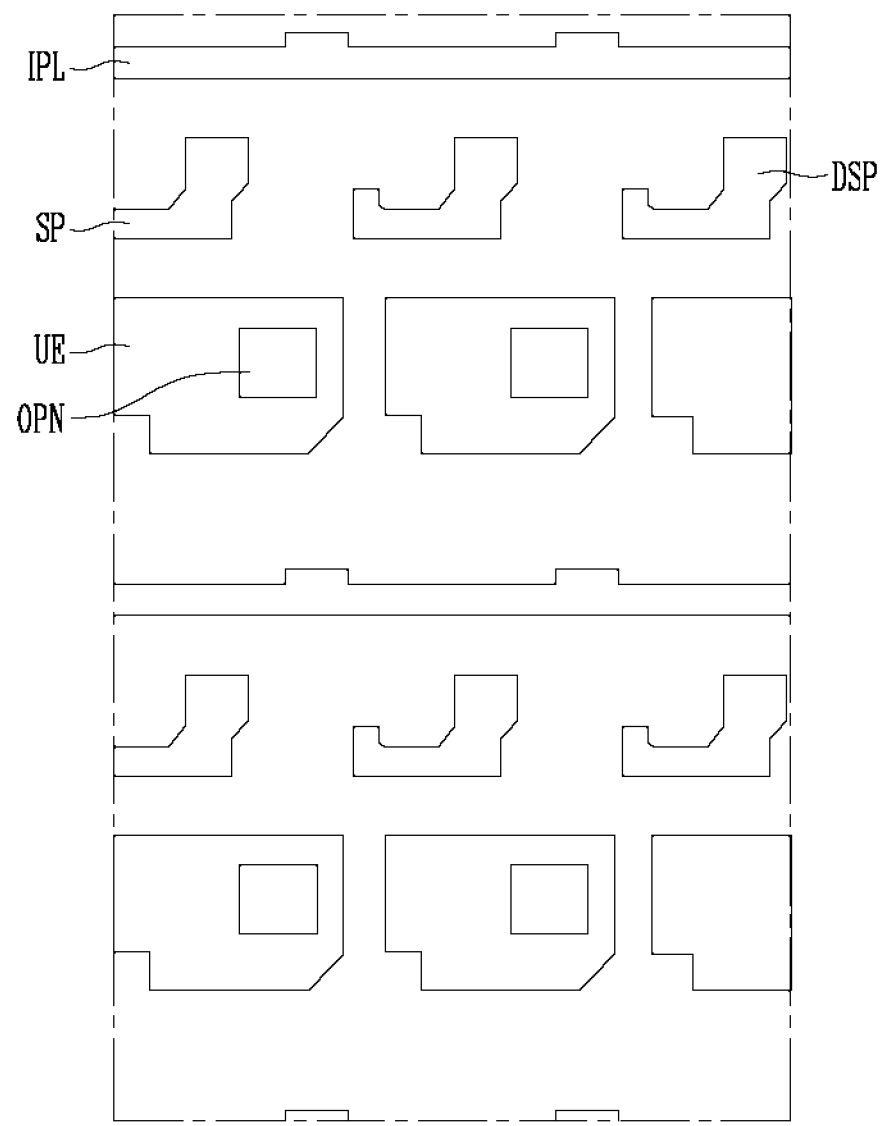
FIG. 14 is a plan view illustrating an initialization power line and an upper electrode of the storage capacitor, which are shown in FIGS. 4 to 10.
Figure 15:
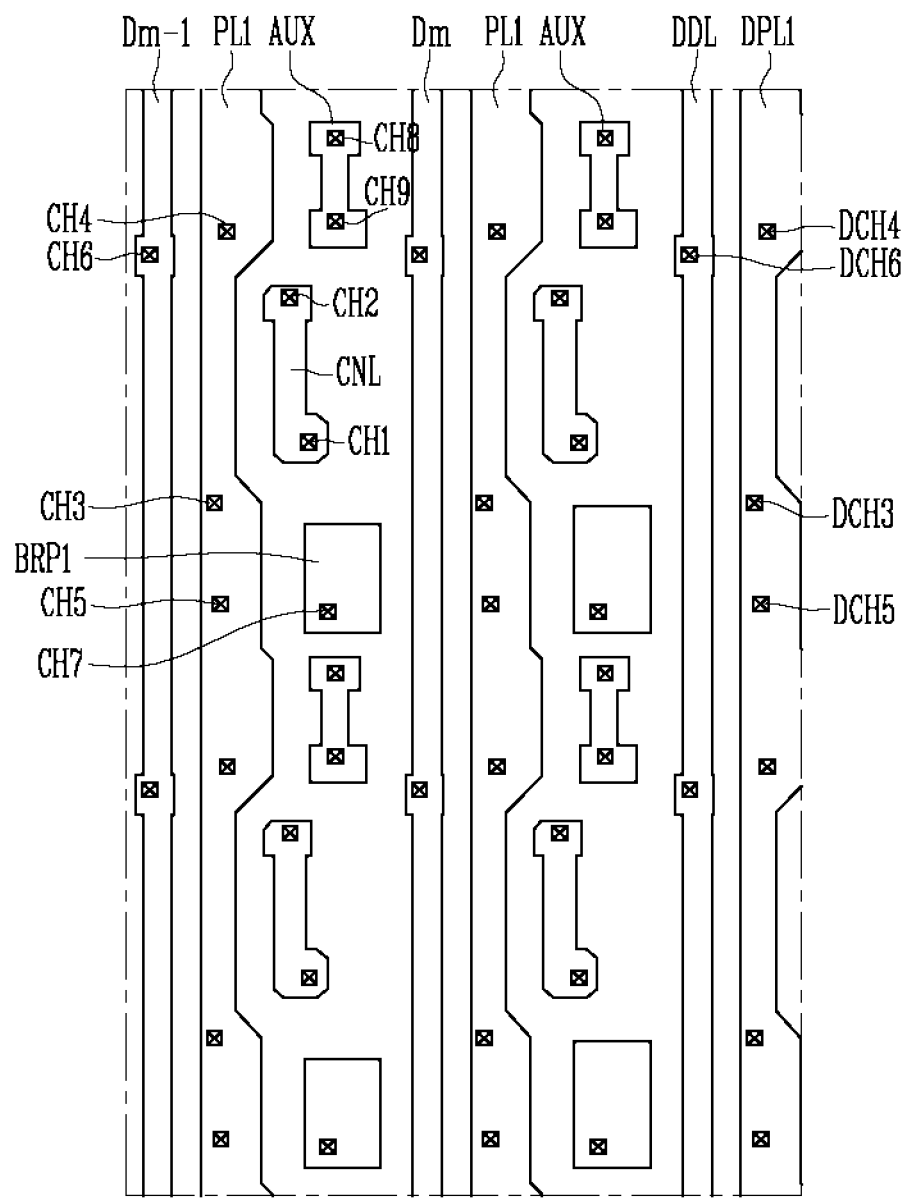
FIG. 15 is a plan view illustrating data lines, a connection line, an auxiliary connection line, a first power supply line of a power line, and a first bridge pattern, which are shown in FIGS. 4 to 10.
Figure 16:
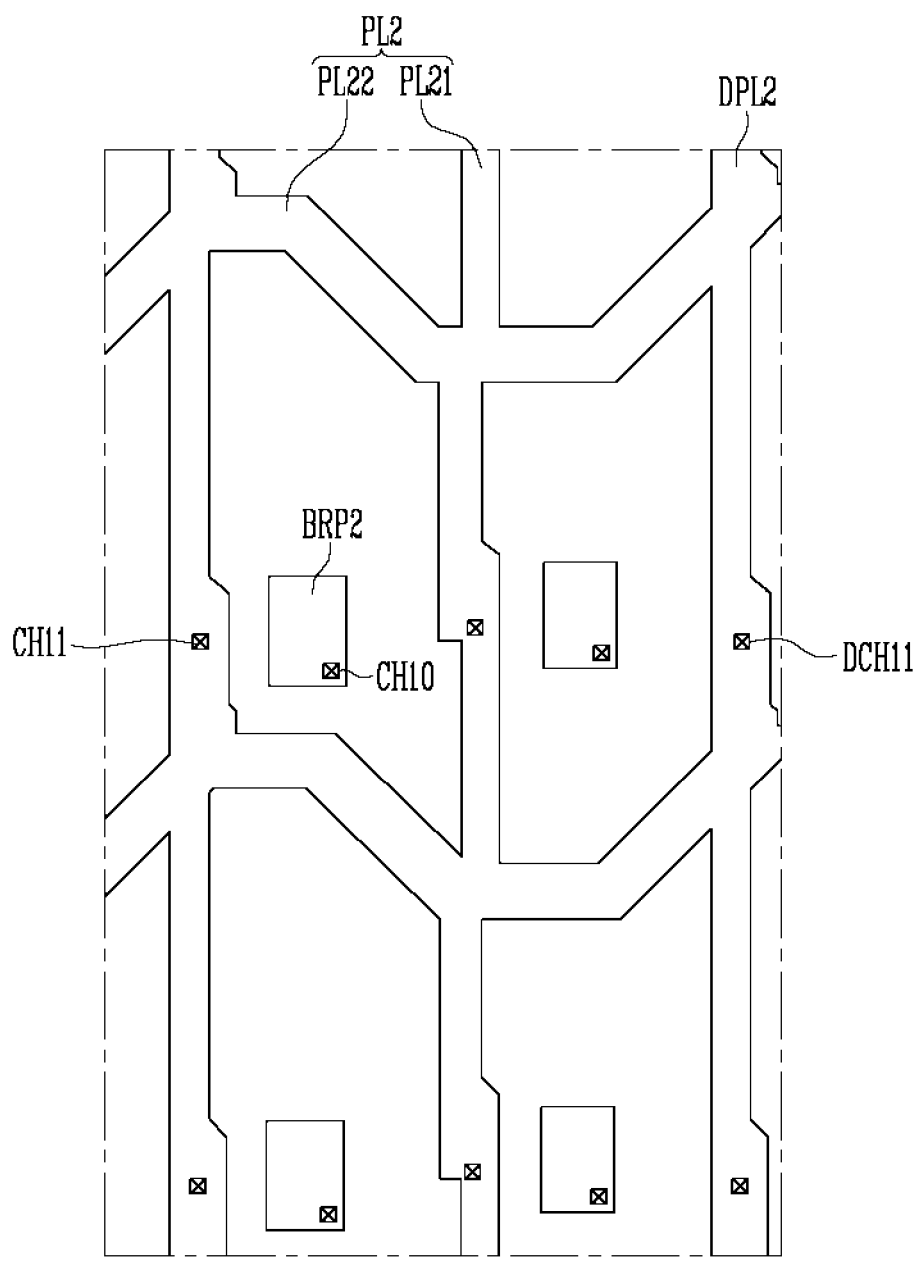
FIG. 16 is a plan view illustrating data lines, a second power supply line of the power line, a connection line, an extension region, and a second bridge pattern, which are shown in FIGS. 4 to 10.
Figure 17:
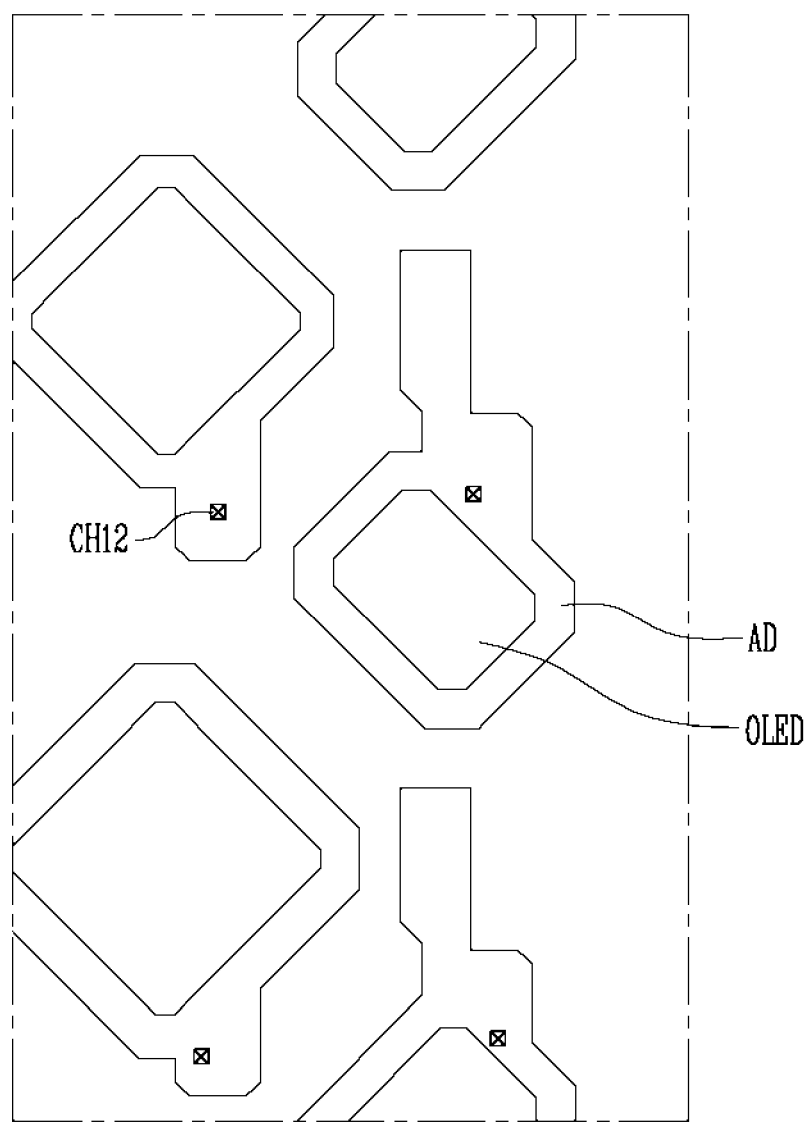
FIG. 17 is a plan view illustrating an organic light emitting device shown in FIGS. 4 to 10.

FIG. 12 is a plan view illustrating the active patterns, the source electrodes, and the drain electrodes, which are shown in FIGS. 4 to 10. FIG. 13 is a plan view illustrating the scan lines, the emission control lines, and the lower electrode of the storage capacitor, which are shown in FIGS. 4 to 10. FIG. 14 is a plan view illustrating the initialization power line and the upper electrode of the storage capacitor, which are shown in FIGS. 4 to 10. FIG. 15 is a plan view illustrating the data lines, the connection line, the auxiliary connection line, the first power supply line of the power line, and the first bridge pattern, which are shown in FIGS. 4 to 10. FIG. 16 is a plan view illustrating the data lines, the second power supply line of the power line, the connection line, an extension region, and the second bridge pattern, which are shown in FIGS. 4 to 10. FIG. 17 is a plan view illustrating the organic light emitting device shown in FIGS. 4 to 10.

Referring to FIGS. 12 to 17 in conjunction with FIGS. 1 to 10, the semiconductor pattern may be provided on the substrate SUB. The semiconductor pattern may include first to seventh active patterns ACT1 to ACT7, the first to seventh source electrode SE1 to SE7, the first to seventh drain electrodes DE1 to DE7, and the dummy semiconductor pattern. The first to seventh active patterns ACT1 to ACT7, the first to seventh source electrode SE1 to SE7, the first to seventh drain electrodes DE1 to DE7, and the dummy semiconductor pattern may include the same material, and may be formed through the same process. The first to seventh active patterns ACT1 to ACT7, the first to seventh source electrode SE1 to SE7, the first to seventh drain electrodes DE1 to DE7, and the dummy semiconductor pattern may include a semiconductor material.

One end of the first active pattern ACT1 may be connected to the first source electrode SE1, and the other end of the first active pattern ACT1 may be connected to the first drain electrode DE1. One end of the second active pattern ACT2 may be connected to the second source electrode SE2, and the other end of the second active pattern ACT2 may be connected to the second drain electrode DE2. One end of the third active pattern ACT3 may be connected to the third source electrode SE3, and the other end of the third active pattern ACT3 may be connected to the third drain electrode DE3. One end of the fourth active pattern ACT4 may be connected to the fourth source electrode SE4, and the other end of the fourth active pattern ACT4 may be connected to the fourth drain electrode DE4. One end of the fifth active pattern ACT5 may be connected to the source electrode SE5, and the other end of the fifth active pattern ACT5 may be connected to the fifth drain electrode DE5. One end of the sixth active pattern ACT6 may be connected to the sixth source electrode SE6, and the other end of the sixth active pattern ACT6 may be connected to the sixth drain electrode DE5. One end of the seventh active pattern ACT7 may be connected to the seventh source electrode SE7, and the other end of the seventh active pattern ACT7 may be connected to the seventh drain electrode DE7.

The dummy semiconductor pattern DSCL may include the dummy second source electrode DSE2, the dummy second active pattern DACT2, the dummy second drain electrode DDE2, the dummy fifth source electrode DSE5, the dummy fifth active pattern DACT5, and the dummy fifth drain electrode DDE5.

The gate insulating layer GI may be provided on the semiconductor pattern, and the (i−1)th scan line Si−1, the ith scan line Si, the (i+1)th scan line Si+1, the ith emission control line Ei, the (i+1)th emission control line Ei+1, and the first to seventh gate electrodes GE1 to GE7 may be provided on the gate insulating layer GI. The (i−1)th scan line Si−1, the ith scan line Si, the (i+1)th scan line Si+1, the ith emission control line Ei, the (i+1)th emission control line Ei+1, and the first to seventh gate electrodes GE1 to GE7 may include the same material and may be formed through the same process.

In the pixels PXL connected to the ith scan line Si, the (i−1)th scan line Si−1, the ith scan line Si, the (i+1)th scan line Si+1, the ith emission control line Ei, and the first to seventh gate electrodes GE1 to GE7 may be provided on the gate insulating layer GI. The second gate electrode GE2 and the third gate electrode GE3 may be integrally formed with the ith scan line Si. The fourth gate electrode GE4 and the seventh gate electrode GE7 may be integrally formed with the (i−1)th scan line Si−1. The fifth gate electrode GE5 and the sixth gate electrode GE6 may be integrally formed with the ith emission control line Ei.

In the pixels PXL connected to the (i+1)th scan line Si+1, the ith scan line Si, the (i+1)th scan line Si+1, the (i+1)th emission control line Ei+1, and the first to seventh gate electrodes GE1 to GE7 may be provided on the gate insulating layer GI. The second gate electrode GE2 and the third gate electrode GE3 may be integrally formed with the (i+1)th scan line Si+1. The fourth gate electrode GE4 and the seventh gate electrode GE7 may be integrally formed with the ith scan line Si. The fifth gate electrode GE5 and the sixth gate electrode GE6 may be integrally formed with the (i+1)th emission control line Ei+1.

In each pixel PXL, the first gate electrode GE1 may become, or may form a portion of, the lower electrode LE of the storage capacitor Cst.

The first interlayer insulating layer IL1 may be provided over the (i−1)th scan line Si−1, the ith scan line Si, the (i+1)th scan line Si+1, the ith emission control line Ei, the (i+1)th emission control line Ei+1, and the first to seventh gate electrodes GE1 to GE7.

The upper electrode UE of the storage capacitor Cst, the shielding pattern SP, the initialization power line IPL, the dummy shielding pattern DSP, and the dummy upper electrode pattern DUE may be provided on the first interlayer insulating layer IL1. The upper electrode UE, the shielding pattern SP, the initialization power line IPL, the dummy shielding pattern DSP, and the dummy upper electrode pattern DUE may include the same material and be formed through the same process.

The second interlayer insulating layer IL2 may be provided on the upper electrode UE of the storage capacitor Cst, the shielding pattern SP, the initialization power line IPL, the dummy shielding pattern DSP, and the dummy upper electrode pattern DUE.

The first conductive pattern may be provided on the second interlayer insulating layer IL2. The first conductive pattern may include the data lines Dm−1 and Dm, the connection line CNL, the auxiliary connection line AUX, the first bridge pattern BRP1, the first power supply line PL1 of the power line PL, the dummy data line DDL, and the dummy first power line DPL1.

The data lines Dm−1 and Dm, the connection line CNL, the auxiliary connection line AUX, the first bridge pattern BRP1, the first power supply line PL1 of the power line PL, the dummy data line DDL, and the dummy first power line DPL1 may include the same material, and may be formed through the same process.

The data lines Dm−1 and Dm may be connected to the second source electrode SE2 through the sixth contact hole CH6 passing through the gate insulating layer GI, the first interlayer insulating layer IL1, and the second interlayer insulating layer IL2.

The connection line CNL1 may be connected to the first gate electrode through the first contact hole CH1 passing through the first interlayer insulating layer IL1 and the second insulating layer IL2. In addition, the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The auxiliary connection line AUX may be connected to the initialization power line IPL through the eighth contact hole CH8 passing through the second interlayer insulating layer IL2. Also, the auxiliary connection line AUX may be connected to the fourth source electrode SE4 and the seventh drain electrode DE7 through the ninth contact hole CH9 passing through the gate insulating layer GI, the first interlayer insulating layer IL1, and the second interlayer insulating layer IL2.

The first bridge pattern BRP1 may be connected to the sixth drain electrode DE6 through the seventh contact hole CH7 passing through the gate insulating layer GI, the first interlayer insulating layer IL1, and the second interlayer insulating layer IL2.

The first power supply line PL1 may be connected to the fifth source electrode SE5 through a fifth contact hole CH5 passing through the gate insulating layer GI, the first interlayer insulating layer IL1, and the second interlayer insulating layer IL2. The first power supply line PL1 may be connected to the upper electrode UE through the third contact hole CH3 passing through the second interlayer insulating layer IL2. The first power supply line PL1 may be electrically connected to the shielding pattern SP through the fourth contact hole CH4 passing through the second interlayer insulating layer IL2.

The dummy data line DDL may be connected to the dummy second source electrode DSE2 through the dummy sixth contact hole DCH6 passing through the gate insulating layer GI, the first interlayer insulating layer IL1, and the second interlayer insulating layer IL2.

The dummy first power line DPL1 may be connected to the dummy upper electrode pattern DUE and the dummy shielding pattern DSP through the dummy third contact hole DCH3 and the dummy fourth contact hole DCH4, which pass through the second interlayer insulating layer. The dummy first power line DPL1 may be connected to the dummy fifth source electrode DSE5 through the dummy fifth contact hole DCH5 passing through the gate insulating layer GI, the first interlayer insulating layer IL1, and the second interlayer insulating layer IL2.

The third interlayer insulating layer IL3 may be provided over the first conductive pattern. The second conductive pattern may be provided on the third interlayer insulating layer IL3. The second conductive pattern may include the second power supply line PL2 of the power line PL, the second bridge pattern BRP2, and the dummy second power line DPL2. The second power supply line PL2 of the power line PL, the second bridge pattern BRP2, and the dummy second power line DPL2 may include the same material and may be formed through the same process.

The second bridge pattern BRP2 may be connected to the first bridge pattern BRP1 through the tenth contact hole CH10 passing through the first insulating layer IL31 and the second insulating layer IL32.

At least a portion of the second power supply line PL2 may overlap with the first power supply line PL1. The second power supply line PL2 may extend in parallel to the data lines Dm−1, Dm, and Dm+1.

The second power supply line PL2 may be connected to the first power supply line PL1 through the eleventh contact hole CH11 passing through the third interlayer insulating layer IL3. For example, the eleventh contact hole CH11 may be located in an area in which the first power supply line PL1 and the second power supply line PL2 overlap with each other, and the first power supply line PL1 and the second power supply line PL2 may be electrically connected to each other through the eleventh contact hole CH11.

The dummy second power line DPL2 may have a shape identical or similar to a first line PL21 of the second power supply line PL2. The dummy second power line DPL2 may be connected to a second line PL22 of the second power supply line PL2. Therefore, the dummy second power line DPL2 may be applied with the first power source ELVDD.

The fourth interlayer insulating layer IL4 may be provided over the fourth conductive pattern, and the organic light emitting device OLED may be provided on the fourth interlayer insulating layer IL4. The organic light emitting device OLED may include the first electrode AD on the fourth interlayer insulating layer IL4, the emitting layer EML on the first electrode AD, and the second electrode CD on the emitting layer EML. The first electrode AD may be connected to the second bridge pattern BRP2 through the twelfth contact hole CH12 passing through the fourth interlayer insulating layer IL4.

Figure 18:
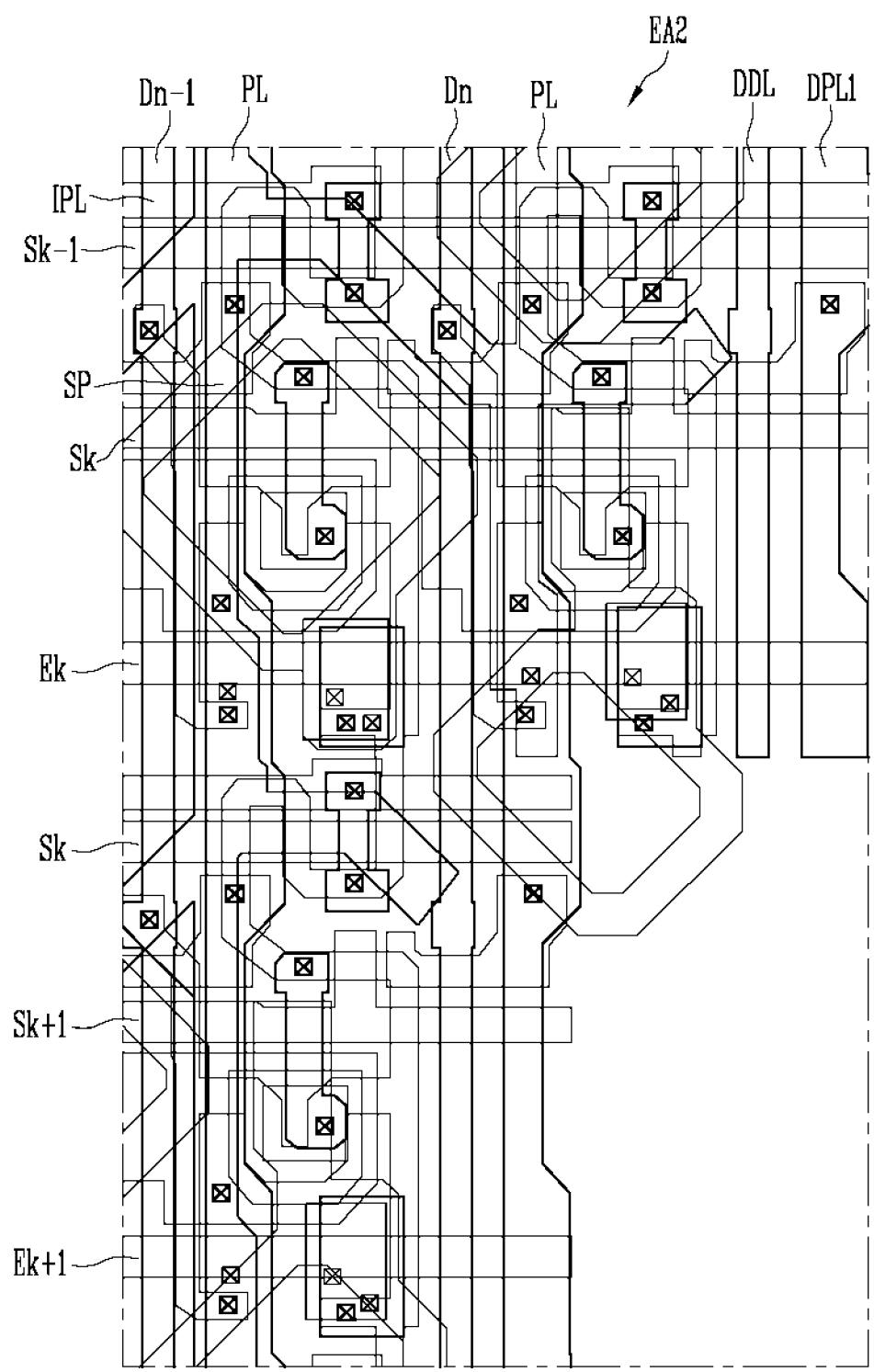
FIG. 18 is an enlarged view of area EA2 of FIG. 1.
Figure 19:
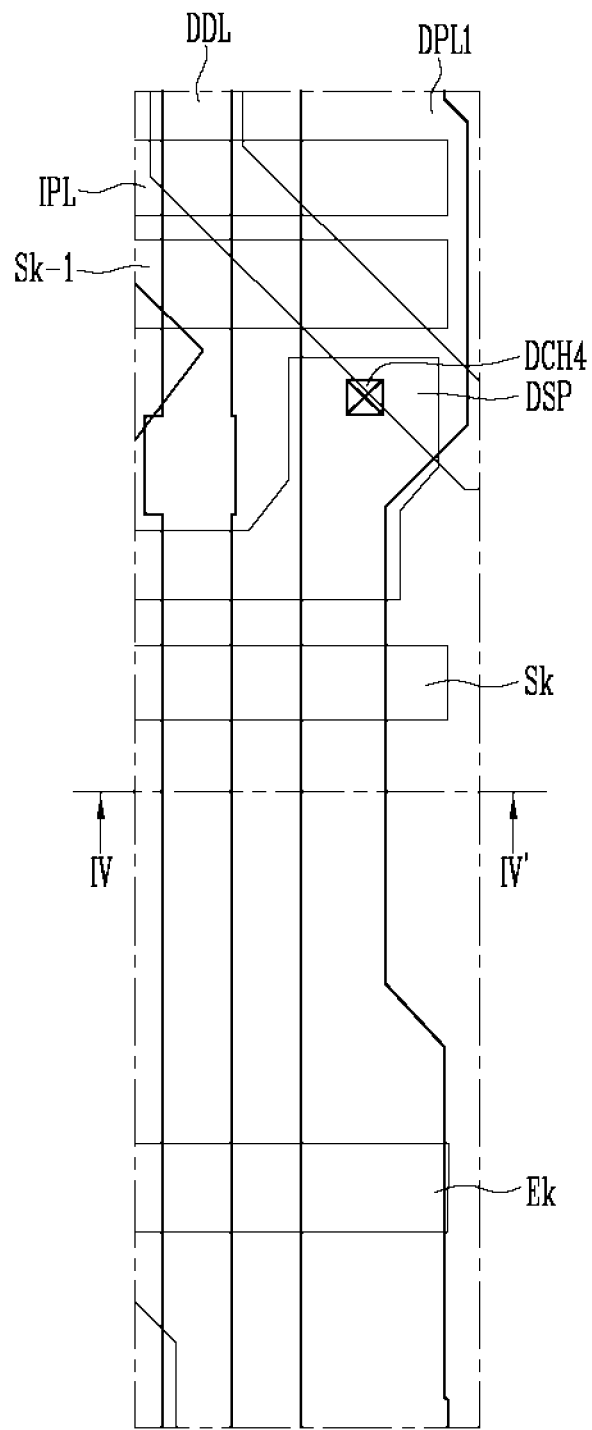
FIG. 19 is an enlarged view of a second dummy part shown in FIG. 18.
Figure 20:
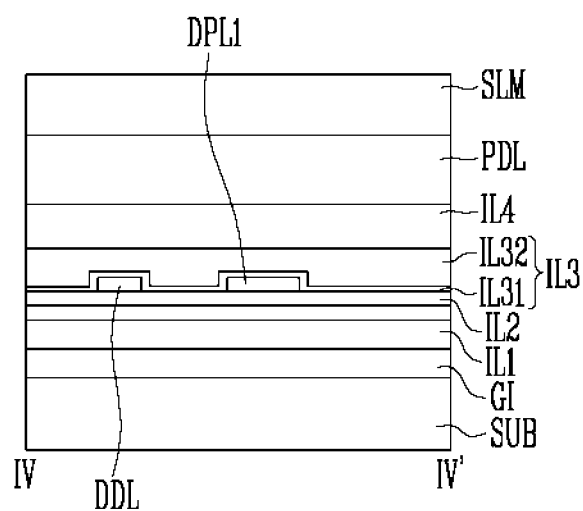
FIG. 20 is a cross-sectional view taken along the line IV-IV' of FIG. 19.

FIG. 18 is an enlarged view of area EA2 of FIG. 1. FIG. 19 is an enlarged view of a second dummy part shown in FIG. 18. FIG. 20 is a cross-sectional view taken along the line IV-IV' of FIG. 19.

In FIGS. 18 to 20, for convenience of description, a pixel connected to a kth scan line, a (k+1)th scan line, an (n−1)th data line, and an nth data line is illustrated as an example.

Referring to FIGS. 1 to 10 and 18 to 20, the display device may include a substrate SUB including a display area PXA and a non-display area PPA, pixels PXL provided in the display area PXA, and a line unit that provides signals to the pixels PXL.

The line unit may provide signals to each of the pixels PXL. The line unit may include scan lines Sk−1, Sk, and Sk+1, data lines Dn−1 and Dn, emission control lines Ek and Ek+1, a power line PL, and an initialization power line IPL.

The pixels PXL may be provided in the display area PXA on the substrate SUB. The pixels PXL may be connected to the scan lines Sk−1, Sk, and Sk+1, the data lines Dn−1 and Dn, the emission control lines Ek and Ek+1, the power line PL, and the initialization power line IPL.

Lengths of the scan lines Sk−1, Sk, and Sk+1, the emission control lines Ek and Ek+1, and the initialization power line IPL, which are provided in a first display area PXA1, may be the same. Lengths of the scan lines Sk−1, Sk, and Sk+1, the emission control lines Ek and Ek+1, and the initialization power line IPL, which are provided in a second display area PXA2, however, may be respectively shorter than those of the scan lines Sk−1, Sk, and Sk+1, the emission control lines Ek and Ek+1, and the initialization power line IPL, which are provided in the first display area PXA1. The lengths of respective ones of the scan lines Sk−1, Sk, and Sk+1, the emission control lines Ek and Ek+1, and the initialization power line IPL, which are provided in the second display area PXA2, may decrease as they become more distant from the first display area PXA1.

A second dummy part may be provided at one portion of the non-display area PPA corresponding to the second display area PXA2. For example, the second dummy part may be provided in the non-display area PPA adjacent to an outermost pixel(s) PXL of the second display area PXA2. That is, with respect to the outermost pixel PXL, the second dummy part may be provided at the opposite side of an outermost data line Dn. For example, the second dummy part may be provided in the non-display area PPA adjacent to a third transistor T3 of the outermost pixel PXL.

In addition, the distance between the second dummy part and the third transistor T3 of the outermost pixel PXL may be less than that between the third transistor T3 of the outermost pixel PXL and the outermost data line Dn.

In the first direction DR1, the width of the second dummy part may be less than that of each pixel PXL.

The second dummy part may include a dummy shielding pattern DSP, a dummy data line DDL, and a dummy first power line DPL1.

The dummy shielding pattern DSP may have a shape identical or similar to the shielding pattern SP. Like the shielding pattern SP, the dummy shielding pattern DSP may cover at least a portion of the third transistor T3 of the outermost pixel PXL.

The dummy data line DDL may have a shape identical or similar to that of the outermost data line Dn. The dummy data line DDL may be connected to the second dummy source electrode DSE2 through the dummy sixth contact hole DCH6. The dummy data line DDL may have a shape extending from a data line that supplies a data signal to a pixel connected to a scan line adjacent to the display area PXA. That is, the dummy data line DDL of the second dummy part corresponding to the pixel PXL connected to a (k+1)the scan line Sk+1 may have a shape extending from an nth data line Dn that supplies a data signal to a pixel PXL connected to a kth scan line.

The dummy first power line DPL1 may have a shape identical or similar to the first power supply line PL1. The dummy first power line DPL1 may have a shape extending from the first power supply line PL1 that supplies the first power source ELVDD to a pixel connected to a scan line adjacent to the first display area PXA1. That is, the dummy first power line DPL1 of the second dummy part corresponding to the pixel PXL connected to the (k+1)th scan line Sk+1 may have a shape extending from the first power supply line PL1 that supplies the first power source ELVDD to the pixel PXL connected to the kth scan line Sk.

The second dummy part forms a parasitic capacitor with outermost pixels PXL connected to the outermost data line among the pixels PXL provided in the second display area PXA2 so that it is possible to reduce or prevent a difference in luminance from occurring between pixels PXL connected to the outermost data lines Dn−1 and Dn and the other pixels PXL.

According to the present disclosure, the display device includes a dummy part that forms a parasitic capacitor with pixels provided at an edge of the display area, so that it is possible to reduce or prevent a difference in luminance from occurring between the pixels. Thus, the display quality of the display device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a substrate having a display area and a non-display area;
a plurality of pixels in the display area;
scan lines for supplying a scan signal to the pixels, the scan lines extending in a first direction;
data lines for supplying a data signal to the pixels, the data lines extending in a second direction crossing the first direction; and
a first dummy part in the non-display area, adjacent to an outermost pixel, connected to an outermost data line of the display area, forming a parasitic capacitor with the outermost pixel, and comprising a first dummy data line and a first dummy power pattern extending in parallel to the data lines.

2. The display device of claim 1, wherein each of the pixels comprises a transistor, and an organic light emitting device connected to the transistor, the transistor comprising:
an active pattern on the substrate;
source and drain electrodes each connected to the active pattern;
a gate electrode overlapping with the active pattern with a gate insulating layer interposed therebetween; and
an interlayer insulating layer covering the gate electrode, and comprising a first interlayer insulating layer, a second interlayer insulating layer, and a third interlayer insulating layer, which are sequentially stacked.

3. The display device of claim 2, further comprising a power line for supplying a power source to the pixels, and comprising:
a first power supply line on the second interlayer insulating layer and parallel to the data lines; and
a second power supply line on the third interlayer insulating layer, and comprising first lines parallel to the data lines, and second lines connecting adjacent ones of the first lines to each other.

4. The display device of claim 3, wherein the data lines are on the second interlayer insulating layer.

5. The display device of claim 3, wherein the scan lines are on the gate insulating layer.

6. The display device of claim 3, wherein the first dummy power pattern comprises:

a dummy first power line on the second interlayer insulating layer, and parallel to the first power supply line; and
a dummy second power line on the third interlayer insulating layer, parallel to the first lines of the second power supply line, and electrically connected to the dummy first power line.

7. The display device of claim 6, wherein the dummy second power line is connected to the second lines of the second power supply line.

8. The display device of claim 6, wherein each of the pixels further comprises a compensation transistor connected to the gate electrode of the transistor, and configured to be turned on when a scan signal is supplied to a corresponding one of the scan lines to cause the transistor to be diode-connected.

9. The display device of claim 8, wherein each of the pixels further comprises a shielding pattern on the first interlayer insulating layer, and covering at least a portion of the compensation transistor.

10. The display device of claim 9, wherein the shielding pattern of one of the pixels is connected to a first power supply line of an adjacent pixel in a direction toward the outermost pixel.

11. The display device of claim 9, wherein each of the pixels further comprises a storage capacitor comprising a lower electrode on the gate insulating layer, and an upper electrode on the first interlayer insulating layer.

12. The display device of claim 9, wherein the first dummy part further comprises:
a dummy semiconductor pattern on the same layer as the active pattern, and extending parallel to the first dummy data line; and
a first dummy shielding pattern on the first interlayer insulating layer, connected to the dummy first power line, and covering at least a portion of the compensation transistor of the outermost pixel.

13. The display device of claim 9, wherein the display area comprises:
a first display area in which lengths of the scan lines are the same; and
a second display area at at least one side of the first display area, and in which lengths of respective ones of the scan lines decrease as the scan lines become more distant from the first display area.

14. The display device of claim 13, wherein the first dummy part is in the non-display area corresponding to the first display area.

15. The display device of claim 13, further comprising a second dummy part in the non-display area adjacent to an outermost pixel of the second display area, and forming a parasitic capacitor with the outermost pixel of the second display area.

16. The display device of claim 15, wherein the second dummy part comprises a second dummy data line and a second dummy power pattern, which extend in parallel to the data lines.

17. The display device of claim 16, wherein the second dummy data line and the second dummy power pattern have a shape extending from a data line and a first power line, which are connected to a pixel connected to one of the scan lines that is more adjacent to the first display area than another of the scan lines that is connected to the outermost pixel.

18. The display device of claim 17, wherein the second dummy part further comprises a second dummy shielding pattern on the first interlayer insulating layer, and connected to the second dummy power pattern.

19. The display device of claim 18, wherein the second dummy shielding pattern covers the compensation transistor of the outermost pixel of the second display area.

20. The display device of claim 15, wherein a width of the second dummy part in the first direction is less than that of each pixel.

21. The display device of claim 1, wherein a width of the first dummy part in the first direction is less than that of each pixel.

22. A display device comprising:
   a substrate comprising a display area and a non-display area;
   a plurality of pixels in the display area and each comprising an organic light emitting device, a driving transistor connected to the organic light emitting device, and a compensation transistor for compensating for a threshold voltage of the driving transistor;
   scan lines for supplying a scan signal to the pixels, and extending in a first direction;
   data lines for supplying a data signal to the pixels, and extending in a second direction crossing the first direction at a respective side of the pixels; and
   a first dummy part at another side of an outermost pixel opposite a respective one of the data lines, connected to an outermost data line of the display area, forming a parasitic capacitor with the outermost pixel, comprising a first dummy data line and a first dummy power pattern, which extend in parallel to the data lines, and forming a parasitic capacitor with the driving transistor and the compensation transistor.

23. The display device of claim 22, wherein the first dummy part and the compensation transistor of the outermost pixel are adjacent to each other.

24. The display device of claim 23, wherein a distance between the first dummy part and the compensation transistor of the outermost pixel is less than that between the compensation transistor of the outermost pixel and the outermost data line.

25. The display device of claim 23, wherein the compensation transistor is connected to a gate electrode of the driving transistor, and is turned on when a scan signal is supplied to cause the driving transistor to be diode-connected.

26. The display device of claim 25, wherein the driving transistor comprises:
   an active pattern on the substrate;
   source and drain electrodes each connected to the active pattern;
   a gate electrode overlapping with the active pattern with a gate insulating layer interposed therebetween; and
   an interlayer insulating layer covering the gate electrode, and comprising a first interlayer insulating layer, a second interlayer insulating layer, and a third interlayer insulating layer, which are sequentially stacked.

27. The display device of claim 26, further comprising a power line for supplying a power source to the pixels, and comprising:
   a first power supply line on the second interlayer insulating layer, and parallel to the data lines; and
   a second power supply line on the third interlayer insulating layer, and comprising first lines parallel to the data lines, and second lines connecting adjacent ones of the first lines to each other.

28. The display device of claim 27, wherein the first dummy power pattern comprises:
   a dummy first power line on the second interlayer insulating layer, and parallel to the first power supply line; and
   a dummy second power line on the third interlayer insulating layer, parallel to the first lines, and electrically connected to the dummy first power line.

29. The display device of claim 28, wherein the dummy second power line is connected to the second lines.

30. The display device of claim 28, wherein each of the pixels further comprises a shielding pattern on the first interlayer insulating layer, and covering at least a portion of the compensation transistor.

31. The display device of claim 30, wherein the shielding pattern of one of the pixels is connected to the first power supply line of an adjacent pixel in a direction toward the outermost pixel.

32. The display device of claim 30, wherein the first dummy part further comprises:
   a dummy semiconductor pattern on the same layer as the active pattern, and extending in a direction parallel to the first dummy data line; and
   a first dummy shielding pattern on the first interlayer insulating layer, connected to the dummy first power line, and covering at least a portion of the compensation transistor of the outermost pixel.

33. The display device of claim 30, wherein the display area comprises:
   a first display area in which lengths of the scan lines are the same; and
   a second display area at at least one side of the first display area, in which lengths of respective ones of the scan lines decrease as the scan lines become more distant from the first display area.

34. The display device of claim 33, wherein the first dummy part is in the non-display area corresponding to the first display area.

35. The display device of claim 33, further comprising a second dummy part in the non-display area, adjacent to an outermost pixel of the second display area, forming a parasitic capacitor with the outermost pixel of the second display area, and comprising a second dummy data line and a second dummy power pattern, which extend in parallel to the data lines.

36. The display device of claim 35, wherein the second dummy data line and the second dummy power pattern have a shape extending from a data line and a first power line, which are connected to a pixel connected to one of the scan lines that is more adjacent to the first display area than another of the scan lines that is connected to the outermost pixel.

37. The display device of claim 36, wherein the second dummy part further comprises a second dummy shielding pattern on the first interlayer insulating layer, and connected to the second dummy power pattern.

38. The display device of claim 37, wherein the second dummy shielding pattern covers the compensation transistor of the outermost pixel of the second display area.

39. The display device of claim 35, wherein a width of the second dummy part in the first direction is less than that of each pixel.

40. The display device of claim 35, wherein a distance between the second dummy part and the compensation transistor of the outermost pixel of the second display area is less than that between the compensation transistor of the outermost pixel and the outermost data line.

41. The display device of claim 22, wherein a width of the first dummy part in the first direction is less than that of each pixel.

* * * * *

UNITED STATES PATENT AND TRADEMARK OFFICE
CERTIFICATE OF CORRECTION

Page 1 of 1

PATENT NO.        : 10,510,822 B2
APPLICATION NO.   : 15/976680
DATED             : December 17, 2019
INVENTOR(S)       : Yang Wan Kim et al.

It is certified that error appears in the above-identified patent and that said Letters Patent is hereby corrected as shown below:

In the Claims

Column 33, Claim 1, Line 10:
Delete ","
After "an outermost pixel"

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*